(12) United States Patent
Yamazaki

(10) Patent No.: US 12,028,635 B2
(45) Date of Patent: Jul. 2, 2024

(54) SOLID-STATE IMAGING DEVICE, AND IMAGING APPARATUS

(71) Applicant: SONY SEMICONDUCTOR SOLUTIONS CORPORATION, Kanagawa (JP)

(72) Inventor: Tomohiro Yamazaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 166 days.

(21) Appl. No.: 17/638,249

(22) PCT Filed: Jul. 14, 2020

(86) PCT No.: PCT/JP2020/027393
§ 371 (c)(1),
(2) Date: Feb. 25, 2022

(87) PCT Pub. No.: WO2021/044737
PCT Pub. Date: Mar. 11, 2021

(65) Prior Publication Data
US 2022/0295004 A1    Sep. 15, 2022

(30) Foreign Application Priority Data
Sep. 5, 2019   (JP) .................................. 2019-162246

(51) Int. Cl.
*H04N 25/75*   (2023.01)
*H04N 25/77*   (2023.01)

(52) U.S. Cl.
CPC ............. *H04N 25/75* (2023.01); *H04N 25/77* (2023.01)

(58) Field of Classification Search
CPC ...... H04N 25/75; H04N 25/77; H04N 25/768; H04N 25/616; H04N 25/79; H04N 25/70;
(Continued)

(56) References Cited

U.S. PATENT DOCUMENTS

2011/0279725 A1   11/2011   Cazaux et al.
2018/0003806 A1   1/2018    Inui
(Continued)

FOREIGN PATENT DOCUMENTS

JP    2011-244452 A   12/2011
JP    2014-510447 A   4/2014
(Continued)

OTHER PUBLICATIONS

International Search Report and Written Opinion of PCT Application No. PCT/JP2020/027393, dated Sep. 15, 2020, 08 pages of ISRWO.

*Primary Examiner* — Ahmed A Berhan
(74) *Attorney, Agent, or Firm* — CHIP LAW GROUP

(57) ABSTRACT

The speed of AD conversion is to be improved in a solid-state imaging device that performs time delay integration. A solid-state imaging device includes: a pair of photoelectric conversion elements; a pair of floating diffusion layers; and a transfer unit that switches the transfer destination of each of the pair of photoelectric conversion elements to one of the pair of floating diffusion layers, and transfers electric charges to the transfer destination. In the solid-state imaging device including the pair of photoelectric conversion elements, the pair of floating diffusion layers, and the transfer unit, the transfer unit switches the transfer destination of each of the pair of photoelectric conversion elements to one of the pair of floating diffusion layers, and transfers electric charges to the transfer destination.

8 Claims, 27 Drawing Sheets

(58) Field of Classification Search
CPC ............. H01L 27/146; H01L 27/14612; H01L 27/1462; H01L 27/14643
See application file for complete search history.

(56) References Cited

U.S. PATENT DOCUMENTS

2018/0124335 A1      5/2018   Machida et al.
2018/0241955 A1*     8/2018   Sakano .................. H04N 25/59

FOREIGN PATENT DOCUMENTS

| | | | |
|---|---|---|---|
| JP | 2015-186006 A | | 10/2015 |
| JP | 2015186006 A | * | 10/2015 |
| JP | 2016-024234 A | | 2/2016 |
| JP | 2018-006989 A | | 1/2018 |
| WO | 2017/169216 A1 | | 10/2017 |

* cited by examiner

| | T23 | T3 | T31 | T32 | T33 | T4 | T41 |
|---|---|---|---|---|---|---|---|
| XHS (130) | | | | | | | |
| | ← EXPOSURE OF F3 | | | | ✗ EXPOSURE OF F4 | | |
| ODD-NUMBERED ROW (252) | | FD1 INITIALIZATION | | TRANSFER TO FD1 | | FD2 INITIALIZATION | |
| EVEN-NUMBERED ROW (252) | | | | TRANSFER TO FD2 | | | |
| ADC (310) | D-PHASE CONVERSION | | P-PHASE CONVERSION | | D-PHASE CONVERSION | | P-PHASE CONVERSION |
| ARITHMETIC CIRCUIT (410) | CDS | | | | CDS | | |
| FD1 (223) | L1+L2 HOLDING | INITIAL STATE | | | L1 HOLDING | | |
| FD2 (224) | L1 HOLDING | | | | L1+L2 HOLDING | INITIAL STATE | |

*FIG. 16*

SOLID-STATE IMAGING DEVICE, AND IMAGING APPARATUS

CROSS REFERENCE TO RELATED APPLICATIONS

This application is a U.S. National Phase of International Patent Application No. PCT/JP3030/027393 filed on Jul. 14, 2020, which claims priority benefit of Japanese Patent Application No. JP 2019-162246 filed in the Japan Patent Office on Sep. 5, 2019. Each of the above-referenced applications is hereby incorporated herein by reference in its entirety.

TECHNICAL FIELD

The present technology relates to solid-state imaging devices. More particularly, the present technology relates to a solid-state imaging device that performs analog-digital conversion for each pixel, and an imaging apparatus.

BACKGROUND ART

Conventionally, time delay integration (TDI) sensors have been used in the fields of factory automation (FA) and aerial photographing. Such a TDI sensor is a sensor that performs a TDI process to integrate charge amounts, while shifting time in accordance with the moving speed of the object. For example, a patent document has disclosed a solid-state imaging device in which two adjacent lines share a floating diffusion layer of one line, and the electric charges in the two lines are transferred to the floating diffusion layer at different times (see Patent Document 1, for example). The TDI process is realized by the charge transfer.

CITATION LIST

Patent Document

Patent Document 1: JP 2014-510447 W

SUMMARY OF THE INVENTION

Problems to be Solved by the Invention

In the conventional technique mentioned above, the TDI process is performed to increase luminance and reduce noise. However, the solid-state imaging device mentioned above transfers the electric charges of two lines to the floating diffusion layer, performs analog-to-digital (AD) conversion, and needs to initialize the floating diffusion layer before starting the next charge transfer. Because of this, the speed of AD conversion drops by an amount equivalent to the time required for initializing the floating diffusion layer.

The present technology has been made in view of such circumstances, and aims to improve the speed of AD conversion in a solid-state imaging device that performs time delay integration.

Solutions to Problems

The present technology has been made to solve the above problems, and a first aspect thereof is a solid-state imaging device that includes: a pair of photoelectric conversion elements; a pair of floating diffusion layers; and a transfer unit that switches the transfer destination of each of the pair of photoelectric conversion elements to one of the pair of floating diffusion layers, and transfers electric charges to the transfer destination. With this configuration, the speed of AD conversion is improved.

Also, in the first aspect, the transfer unit may simultaneously perform a process of transferring electric charges from one of the pair of photoelectric conversion elements to the other one of the pair of floating diffusion layers, and a process of transferring electric charges from the other one of the pair of photoelectric conversion elements to one of the pair of floating diffusion layers. With this arrangement, the speed of AD conversion is improved, compared with that in a case where those transfers are sequentially performed.

Also, in the first aspect, the transfer unit may include: a first transfer transistor that transfers electric charges from one of the pair of photoelectric conversion elements to one of the pair of floating diffusion layers; a second transfer transistor that transfers electric charges from the one of the pair of photoelectric conversion elements to the other one of the pair of floating diffusion layers; a third transfer transistor that transfers electric charges from the other one of the pair of photoelectric conversion elements to the one of the pair of floating diffusion layers; and a fourth transfer transistor that transfers electric charges from the other one of the pair of photoelectric conversion elements to the other one of the pair of floating diffusion layers. With this arrangement, the transfer destination of each of the pair of photoelectric conversion elements can be switched to one of the pair of floating diffusion layers.

Further, in the first aspect, a pair of charge emission transistors that emit electric charges from each of the pair of photoelectric conversion elements may be further included. With this arrangement, the photoelectric conversion elements are initialized.

Also, in the first aspect, a pair of reset transistors that initialize each of the pair of floating diffusion layers may be further included. With this arrangement, the floating diffusion layers are initialized.

Further, in the first aspect, a pair of conversion efficiency control transistors that control the charge-voltage conversion efficiency of the pair of floating diffusion layers may be further included. With this arrangement, the charge-voltage conversion efficiency can be changed.

Also, in the first aspect, a pair of amplification transistors that amplify the voltage of each of the pair of floating diffusion layers to generate a pair of pixel signals, and a pair of select transistors that select one of the pair of pixel signals may be further included. With this arrangement, the selected pixel signal is output.

Further, in the first aspect, an analog-to-digital converter that sequentially converts the respective pixel signals of the pair of pixel signals into digital signals may be further included. With this arrangement, a plurality of digital signals is generated.

Also, in the first aspect, an arithmetic circuit that integrates the digital signals may be further included. With this arrangement, a digital TDI process is performed.

Further, a second aspect of the present technology is an imaging apparatus that includes: a pair of photoelectric conversion elements; a pair of floating diffusion layers; a transfer unit that switch the transfer destination of each of the pair of photoelectric conversion elements to one of the pair of floating diffusion layers, and transfers electric charges to the transfer destination; and a signal processing unit that converts a pixel signal corresponding to the amount of the electric charges into a digital signal, and processes the digital signal. With this configuration, digital signals are processed, and the speed of AD conversion is improved.

BRIEF DESCRIPTION OF DRAWINGS

FIG. 14 is a timing chart showing an example operation of the solid-state imaging device until the end of the exposure of the second frame according to the first embodiment of the present technology.

FIG. 15 is a timing chart showing an example operation of the solid-state imaging device until the initialization of the floating diffusion layers of the fourth frame according to the first embodiment of the present technology.

FIG. 16 is a timing chart showing an example operation of the solid-state imaging device until the end of the exposure of the fifth frame according to the first embodiment of the present technology.

MODES FOR CARRYING OUT THE INVENTION

The following is a description of modes for carrying out the present technology (the modes will be hereinafter referred to as embodiments). Explanation will be made in the following order.

1. First Embodiment (an example in which each charge transfer destination of a pair of photoelectric conversion elements is switched)
2. Second Embodiment (an example in which transistors are reduced, and each charge transfer destination of a pair of photoelectric conversion elements is switched)

1. First Embodiment

Example Configuration of an Imaging Apparatus

Figure 1:
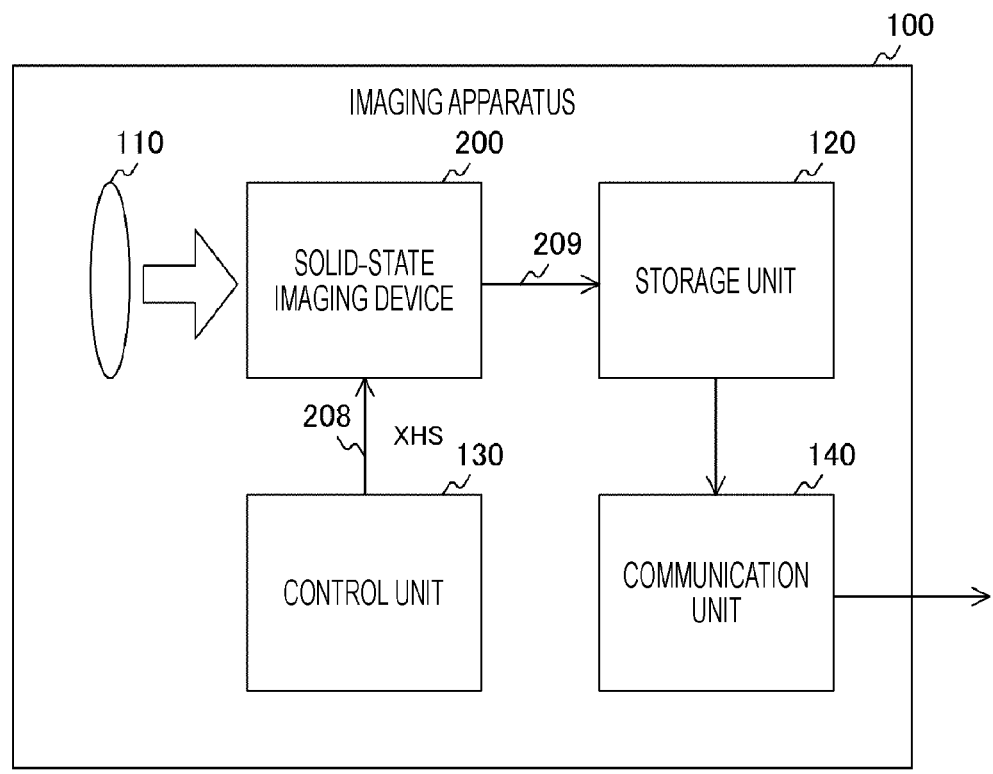
FIG. 1 is a block diagram showing an example configuration of an imaging apparatus according to a first embodiment of the present technology.

FIG. 1 is a block diagram showing an example configuration of an imaging apparatus 100 according to an embodiment of the present technology. The imaging apparatus 100 is an apparatus that captures image data, and includes an optical unit 110, a solid-state imaging device 200, a storage unit 120, a control unit 130, and a communication unit 140.

The optical unit 110 gathers incident light and guides the incident light to the solid-state imaging device 200. The solid-state imaging device 200 captures image data. The solid-state imaging device 200 supplies image data to the storage unit 120 via a signal line 209.

The storage unit 120 stores the image data. The control unit 130 controls the solid-state imaging device 200 to capture image data. The control unit 130 supplies a synchronization signal XHS indicating the imaging timing to the solid-state imaging device 200 via a signal line 208, for example.

The communication unit 140 reads image data from the storage unit 120, and transmits the image data to the outside.

Figure 2:
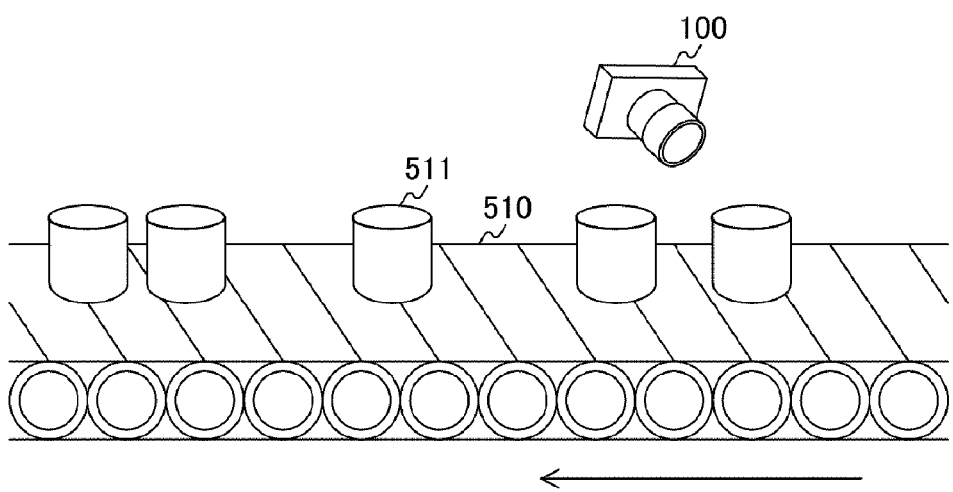
FIG. 2 is a diagram for explaining an example of usage of the imaging apparatus according to the first embodiment of the present technology.

FIG. 2 is a diagram for explaining an example of usage of the imaging apparatus 100 according to the first embodiment of the present technology. As shown in the drawing, the imaging apparatus 100 is used in a factory or the like in which a conveyor belt 510 is installed.

The conveyor belt 510 moves an object 511 in a predetermined direction at a constant speed. The imaging apparatus 100 is secured in the vicinity of the conveyor belt 510, and images the object 511 to generate image data. The image data is used for inspection on the presence/absence of a defect, for example. With this arrangement, FA is realized.

Note that the imaging apparatus 100 images the object 511 moving at a constant speed, but is not limited to this configuration. The imaging apparatus 100 may be designed to move at a constant speed with respect to an object and perform imaging such as aerial photographing.

Example Configuration of a Solid-State Imaging Device

Figure 3:
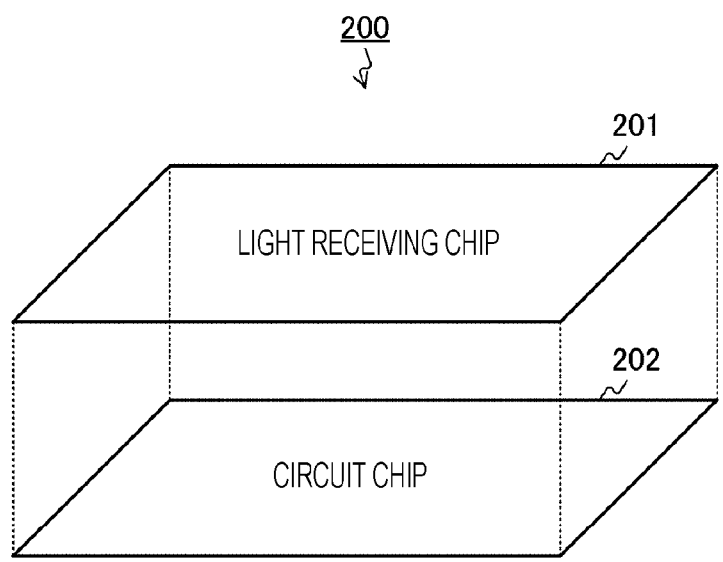
FIG. 3 is a diagram showing an example stack structure of a solid-state imaging device according to the first embodiment of the present technology.

FIG. 3 is a diagram showing an example stack structure of the solid-state imaging device 200 according to the first embodiment of the present technology. The solid-state imaging device 200 includes a circuit chip 202 and a light receiving chip 201 stacked on the circuit chip 202. These chips are electrically connected via a connecting portion such as a via. Note that these chips can be connected by Cu—Cu bonding or bumps, instead of a via.

Figure 4:
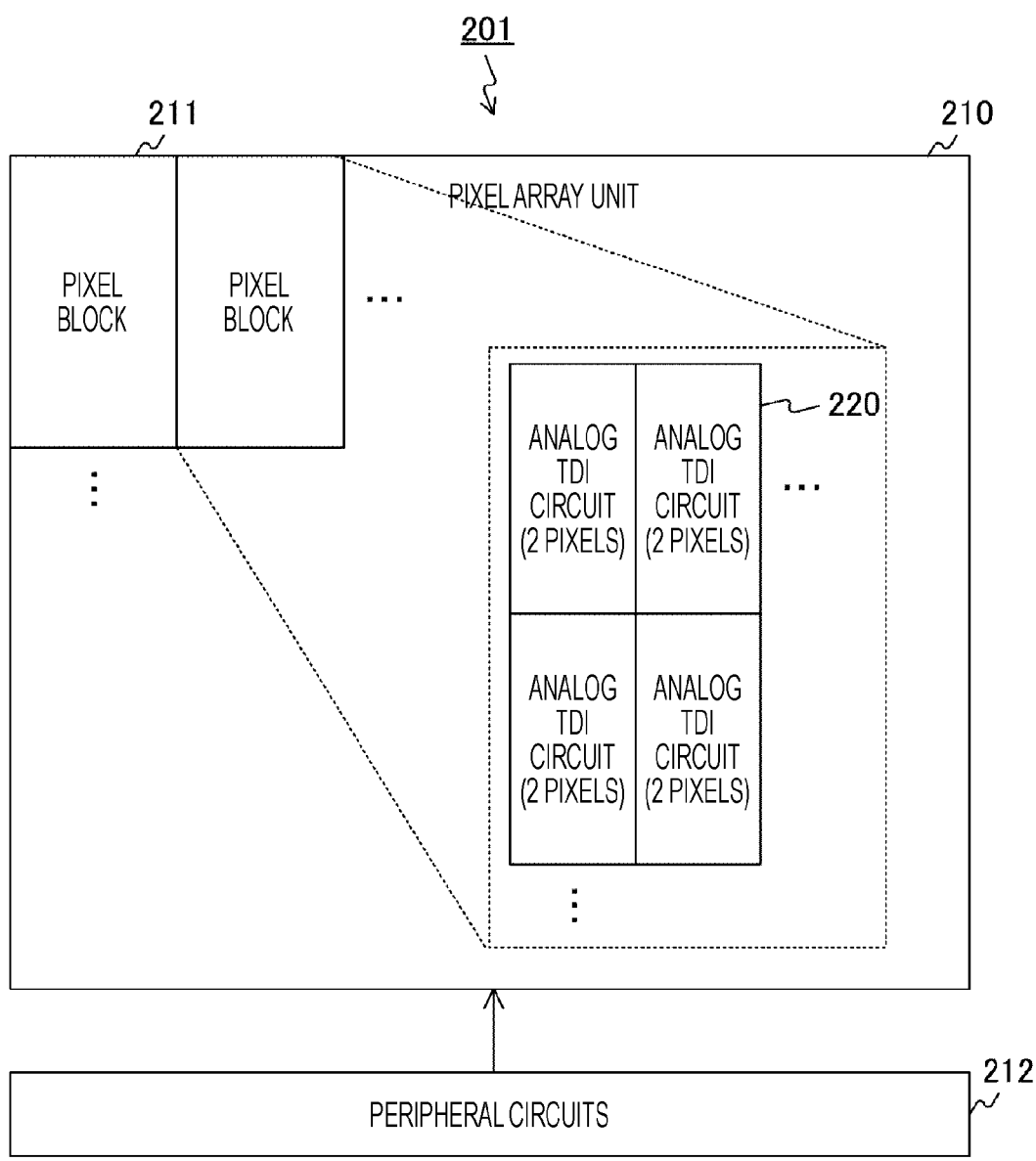
FIG. 4 is a block diagram showing an example configuration of a light receiving chip according to the first embodiment of the present technology.

FIG. 4 is a block diagram showing an example configuration of the light receiving chip 201 according to the first embodiment of the present technology. A pixel array unit 210 and peripheral circuits 212 are provided in the light receiving chip 201.

In the pixel array unit 210, a plurality of pixels is arranged in a two-dimensional lattice pattern. In the pixel array unit 210, a set of pixels aligned in the horizontal direction is called a "row" or a "line", and a set of pixels aligned in the vertical direction is called a "column".

Further, the pixel array unit 210 is divided into a plurality of pixel blocks 211. In each pixel block 211, eight rows×two columns of pixels are disposed, for example. Furthermore, two pixels adjacent to each other in the column direction constitute one analog TDI circuit 220. In a case where eight rows×two columns of pixels are disposed in a pixel block 211, the number of analog TDI circuits 220 in the pixel block 211 is eight (four rows×two columns). The circuit configuration of the analog TDI circuits 220 will be described later.

The peripheral circuits 212 include a circuit that supplies direct current (DC) voltage and the like, for example.

Figure 5:
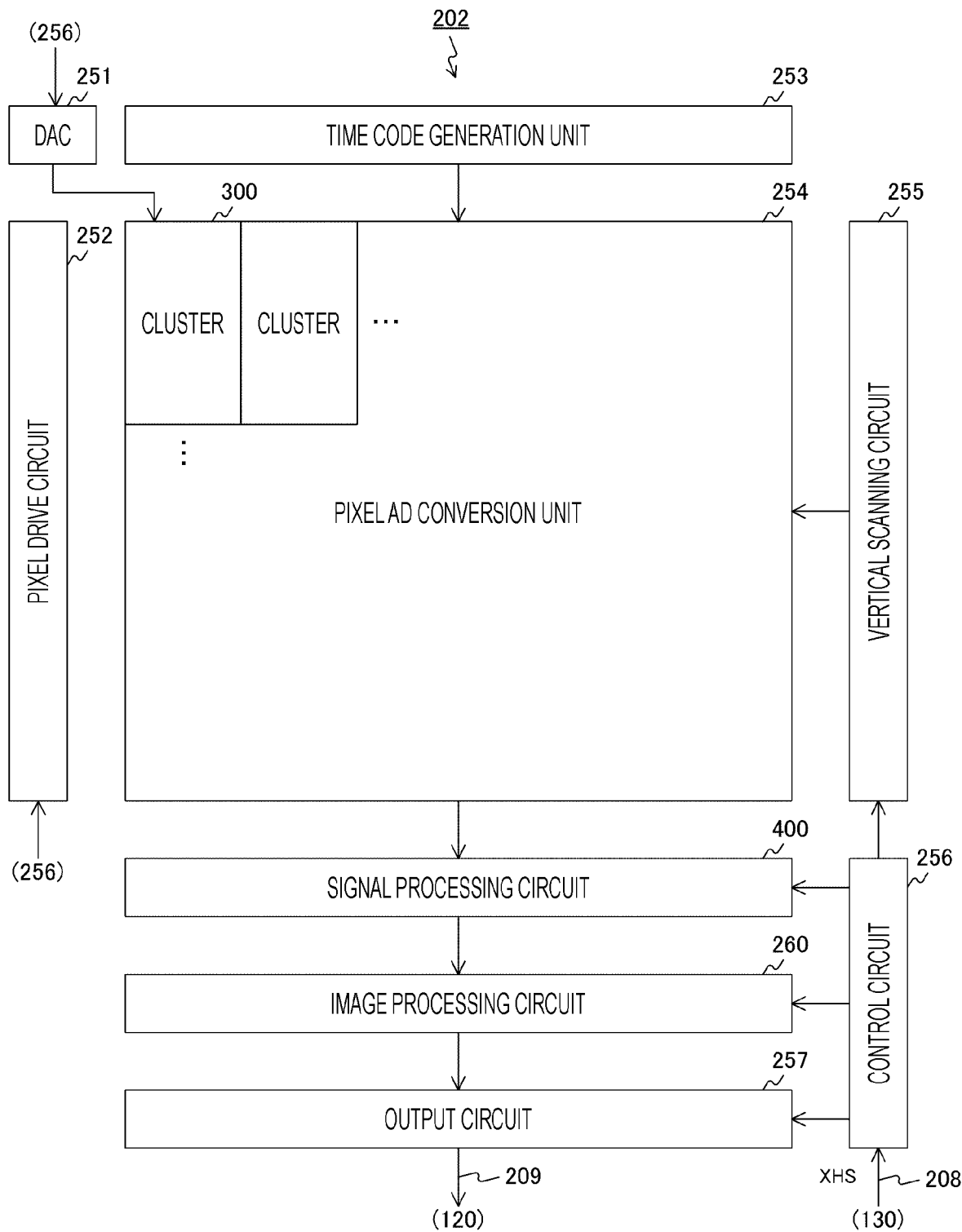
FIG. 5 is a block diagram showing an example configuration of a circuit chip according to the first embodiment of the present technology.

FIG. 5 is a block diagram showing an example configuration of the circuit chip 202 according to the first embodiment of the present technology. In the circuit chip 202, a digital-to-analog converter (DAC) 251, a pixel drive circuit 252, a time code generation unit 253, a pixel AD conversion unit 254, and a vertical scanning circuit 255 are disposed. Further, in the circuit chip 202, a control circuit 256, a signal processing circuit 400, an image processing circuit 260, and an output circuit 257 are disposed.

The DAC 251 generates a reference signal by digital-to-analog (DA) conversion over a predetermined AD conversion period. For example, a sawtooth ramp signal is used as the reference signal. The DAC 251 supplies the reference signal to the pixel AD conversion unit 254.

The time code generation unit 253 generates a time code indicating a time within the AD conversion period. The time code generation unit 253 is formed with a counter, for example. As the counter, a gray code counter is used, for example. The time code generation unit 253 supplies the time code to the pixel AD conversion unit 254.

The pixel drive circuit 252 drives each of the analog TDI circuits 220 to generate an analog pixel signal.

The pixel AD conversion unit 254 performs AD conversion for converting the analog signal (which is a pixel signal) of each of the analog TDI circuits 220 into a digital signal. The pixel AD conversion unit 254 is divided into a plurality of clusters 300. A cluster 300 is provided for each pixel block 211, and converts an analog signal in the corresponding pixel block 211 into a digital signal.

The pixel AD conversion unit 254 generates a frame that is image data in which digital signals are aligned as a result of the AD conversion, and supplies the frame to the signal processing circuit 400.

The vertical scanning circuit 255 drives the pixel AD conversion unit 254 to perform the AD conversion.

The signal processing circuit 400 performs predetermined signal processing on the frame. As the signal processing, various kinds of processing including a correlated double sampling (CDS) process and a digital TDI process are performed. The signal processing circuit 400 supplies the processed frame to the image processing circuit 260.

The image processing circuit 260 executes predetermined image processing on the frame supplied from the signal processing circuit 400. As the image processing, an image recognition process, a black level correction process, an image correction process, a demosaicing process, and the like are performed. The image processing circuit 260 supplies the processed frame to the output circuit 257.

The output circuit 257 outputs the frame subjected to the image processing, to the outside.

The control circuit 256 controls operation timings of the DAC 251, the pixel drive circuit 252, the vertical scanning circuit 255, the signal processing circuit 400, the image processing circuit 260, and the output circuit 257 in synchronization with the synchronization signal XHS.

Figure 6:
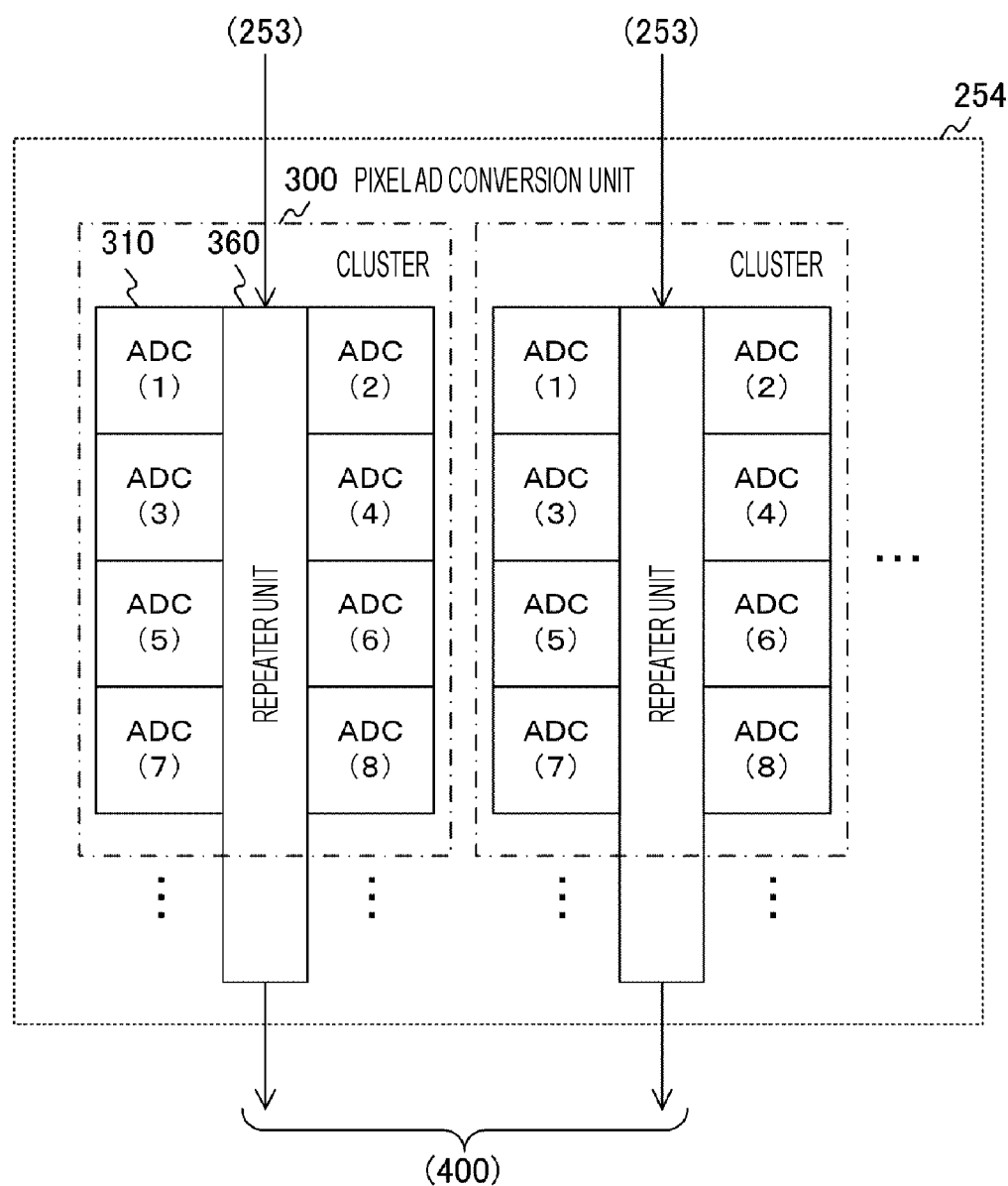
FIG. 6 is a diagram showing an example configuration of a pixel AD conversion unit according to the first embodiment of the present technology.

FIG. 6 is a diagram showing an example configuration of the pixel AD conversion unit 254 according to the first embodiment of the present technology. In the pixel AD conversion unit 254, a plurality of ADCs 310 is arranged in a two-dimensional lattice pattern. The ADCs 310 are provided for the respective analog TDI circuits 220. In a case where the number of rows and the number of columns of pixels are N (N being an integer) and M (M being an integer), the number of the analog TDI circuits 220 is N×M/2, and accordingly, N×M/2 ADCs 310 are provided.

In each of the clusters 300, the same number of ADCs 310 as the number of analog TDI circuits 220 in a pixel block 211 are provided. In a case where four rows and two columns of analog TDI circuits 220 are provided in a pixel block 211, four rows and two columns of ADCs 310 are also provided in the cluster 300.

An ADC 310 performs AD conversion on an analog pixel signal generated by the corresponding analog TDI circuit 220. In the AD conversion, the ADC 310 compares the pixel signal with the reference signal, and holds the time code at the time when the comparison result is inverted. The ADC 310 then outputs the held time code as a digital signal after the AD conversion.

Further, a repeater unit 360 is provided for each column of clusters 300. In a case where the number of columns of clusters 300 is M/2, M/2 repeater units 360 are provided. The repeater units 360 transfer a time code. The repeater units 360 transfer a time code from the time code generation unit 253 to the ADCs 310. The repeater units 360 also transfer digital signals from the ADCs 310 to the signal processing circuit 400. This transfer of digital signals is also called "reading" of digital signals.

Further, in the drawing, the numbers shown in parentheses indicate an example of the reading order of digital signals from the ADCs 310. For example, the digital signals in the odd-numbered columns of the first row are read first, and the digital signals in the even-numbered columns of the first row are read second. The digital signals in the odd-numbered columns of the second row are read third, and the digital signals in the even-numbered columns of the second row are read fourth. Likewise, the digital signals in the odd-numbered columns and the even-numbered columns of each row are sequentially read thereafter.

Note that an ADC 310 is provided for each analog TDI circuit 220, but the present invention is not limited to this configuration. A configuration in which a plurality of analog TDI circuits 220 shares one ADC 310 may be adopted.

Configuration Example of an ADC

Figure 7:
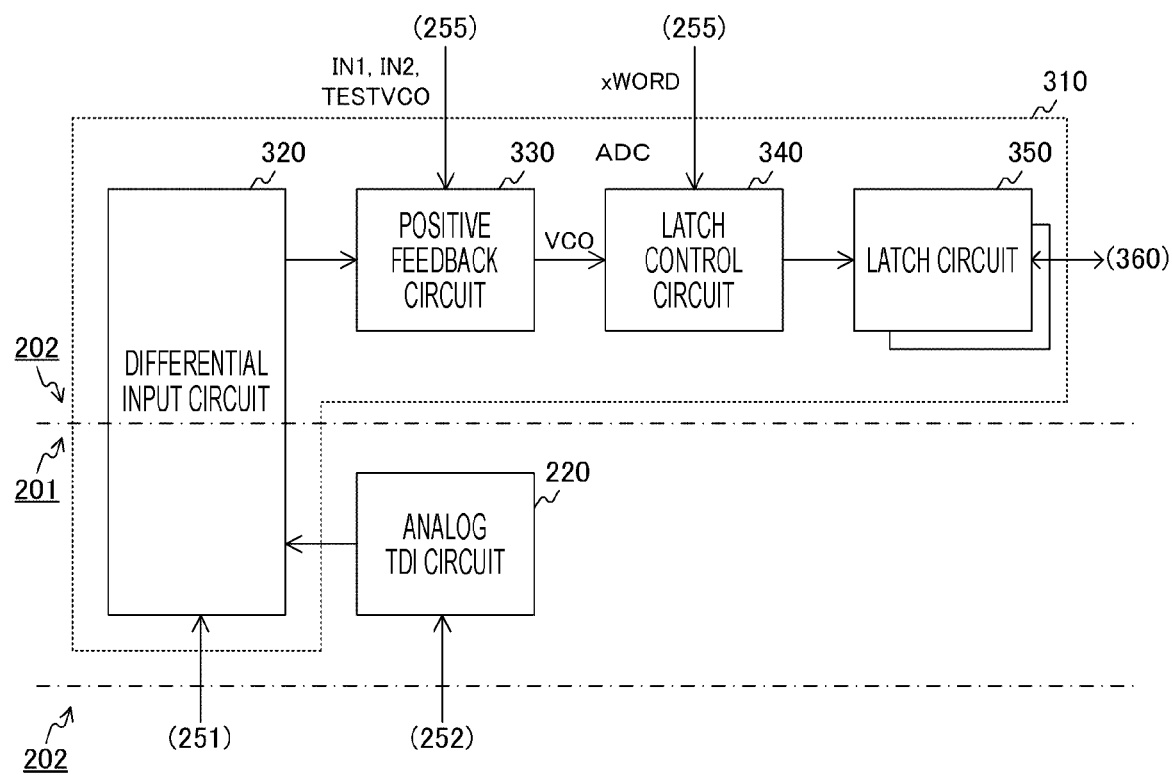
FIG. 7 is a block diagram showing an example configuration of an analog-to-digital converter (ADC) according to the first embodiment of the present technology.

FIG. 7 is a block diagram showing an example configuration of an ADC 310 according to the first embodiment of the present technology. The ADC 310 includes a differential input circuit 320, a positive feedback circuit 330, a latch control circuit 340, and a plurality of latch circuits 350.

Further, the analog TDI circuit 220 and part of the differential input circuit 320 are disposed in the light receiving chip 201, and the rest of the differential input circuit 320 and the circuits in the later stages are disposed in the circuit chip 202.

The differential input circuit 320 compares a pixel signal from the analog TDI circuit 220 with the reference signal from the DAC 251. The differential input circuit 320 supplies a comparison result signal indicating a comparison result to the positive feedback circuit 330.

The positive feedback circuit 330 adds part of an output to an input (the comparison result signal), and supplies the result as an output signal VCO to the latch control circuit 340.

The latch control circuit 340 causes the plurality of latch circuits 350 to hold the time code at the time when the output signal VCO is inverted, in accordance with a control signal xWORD from the vertical scanning circuit 255.

The latch circuits 350 hold a time code from the repeater unit 360, under the control of the latch control circuit 340. The number of the latch circuits 350 is the same as the number of the bits in a time code. For example, in a case where a time code is formed with 15 bits, 15 latch circuits 350 are provided in the ADC 310. Further, the held time code is read as an AD-converted digital signal by the repeater unit 360.

With the configuration shown in the drawing, the ADC 310 converts a pixel signal from the analog TDI circuit 220 into a digital signal.

Example Configuration of an Analog TDI Circuit

Figure 8:
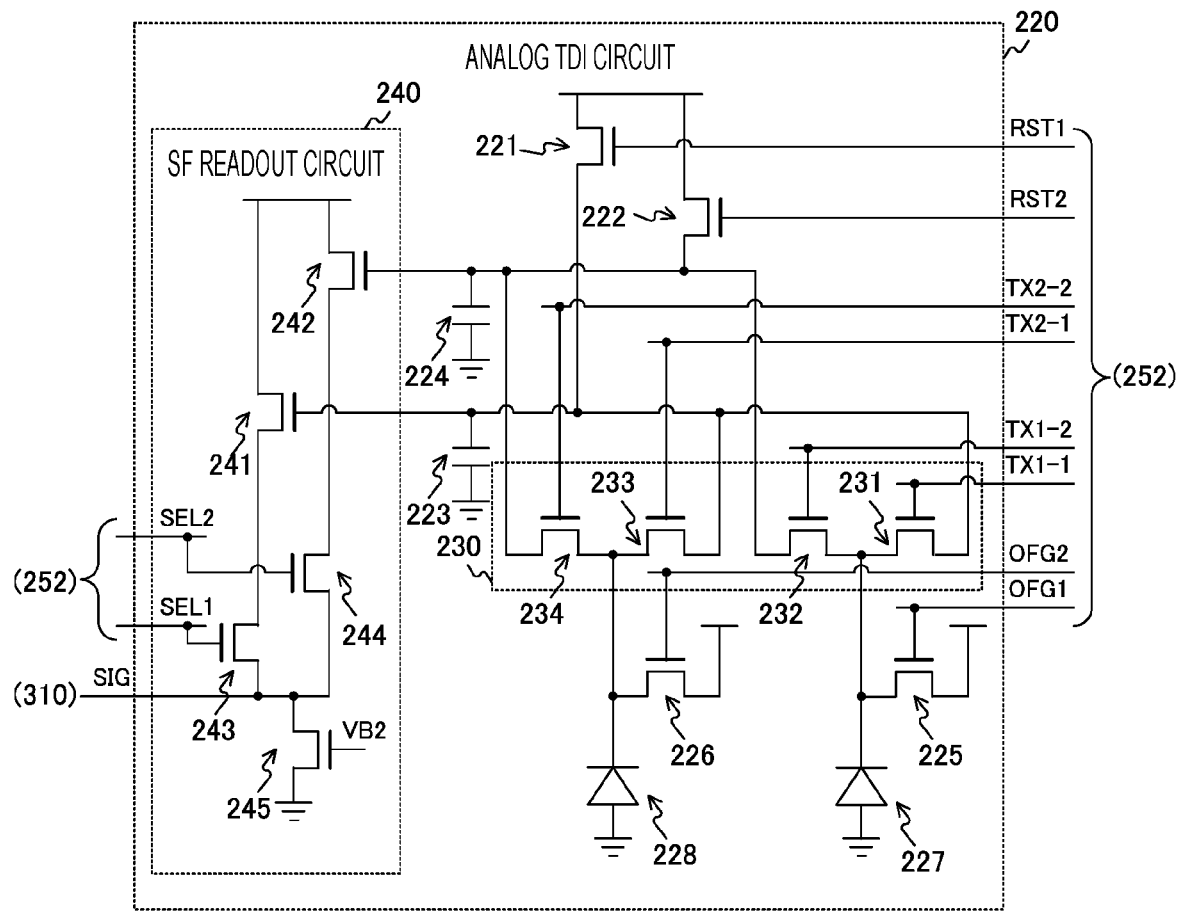
FIG. 8 is a circuit diagram showing an example configuration of an analog TDI circuit according to the first embodiment of the present technology.

FIG. 8 is a circuit diagram showing an example configuration of an analog TDI circuit 220 according to the first embodiment of the present technology. The analog TDI circuit 220 includes reset transistors 221 and 222, floating diffusion layers 223 and 224, a transfer unit 230, charge emission transistors 225 and 226, and photoelectric conversion elements 227 and 228. Further, the analog TDI circuit 220 includes a source follower (SF) readout circuit 240. The transistors (such as the reset transistor 221) in the analog TDI circuit 220 may be n-channel metal oxide semiconductor (nMOS) transistors, for example.

The reset transistor 221 initializes the charge amount in the floating diffusion layer 223, in accordance with a reset signal RST1 from the pixel drive circuit 252. The reset transistor 222 initializes the charge amount in the floating diffusion layer 224, in accordance with a reset signal RST2 from the pixel drive circuit 252.

The floating diffusion layers 223 and 224 accumulate electric charges, and generate voltages corresponding to the charge amounts. Note that the floating diffusion layers 223 and 224 are an example of the pair of floating diffusion layers disclosed in the claims.

The transfer unit 230 switches the transfer destination of each of the photoelectric conversion elements 227 and 228 to one of the floating diffusion layers 223 and 224, and transfers electric charges to the transfer destination. The transfer unit 230 includes transfer transistors 231 to 234.

The transfer transistor 231 transfers electric charges from the photoelectric conversion element 227 to the floating diffusion layer 223, in accordance with a transfer signal TX1-1 from the pixel drive circuit 252. The transfer transistor 232 transfers electric charges from the photoelectric conversion element 227 to the floating diffusion layer 224, in accordance with a transfer signal TX1-2 from the pixel drive circuit 252. Note that the transfer transistor 231 is an example of the first transfer transistor disclosed in the claims, and the transfer transistor 232 is an example of the second transfer transistor disclosed in the claims.

The transfer transistor 233 transfers electric charges from the photoelectric conversion element 228 to the floating diffusion layer 223, in accordance with a transfer signal TX2-1 from the pixel drive circuit 252. The transfer transistor 234 transfers electric charges from the photoelectric conversion element 228 to the floating diffusion layer 224, in accordance with a transfer signal TX2-2 from the pixel drive circuit 252. Note that the transfer transistor 233 is an example of the third transfer transistor disclosed in the claims, and the transfer transistor 234 is an example of the fourth transfer transistor disclosed in the claims.

The charge emission transistor 225 extracts electric charges from the photoelectric conversion element 227 and performs initialization, in accordance with an emission signal OFG1 from the pixel drive circuit 252. The charge emission transistor 226 extracts electric charges from the photoelectric conversion element 228 and performs initialization, in accordance with an emission signal OFG2 from the pixel drive circuit 252.

The photoelectric conversion elements 227 and 228 convert light into electric charges. The photoelectric conversion elements 227 and 228 are disposed in different rows from each other. For example, the photoelectric conversion element 227 is disposed in an odd-numbered row (such as the first row), and the photoelectric conversion element 228 is disposed in an even-numbered row (such as the second row) adjacent to the photoelectric conversion element 227. Note that the photoelectric conversion elements 227 and 228 are an example of the pair of photoelectric conversion elements disclosed in the claims.

The SF readout circuit 240 outputs a pixel signal corresponding to the voltage of either one of the floating diffusion layers 223 and 224. The SF readout circuit 240 includes amplification transistors 241 and 242, select transistors 243 and 244, and a current source transistor 245.

The amplification transistor 241 amplifies the voltage of the floating diffusion layer 223. The amplification transistor 242 amplifies the voltage of the floating diffusion layer 224.

The select transistor 243 outputs a pixel signal SIG that is a signal of the voltage amplified by the amplification transistor 241 to the ADC 310, in accordance with a select signal SEL1 from the pixel drive circuit 252. The select transistor 244 outputs a pixel signal SIG that is a signal of the voltage amplified by the amplification transistor 242 to the ADC 310, in accordance with a select signal SEL2 from the pixel drive circuit 252.

The current source transistor 245 supplies constant current to the amplification transistors 241 and 242 and the select transistors 243 and 244.

In the drawing, the analog TDI circuits 220 are disposed in the first row and the second row. A reset signal RSTn, a transfer signal TXn-1, a transfer signal TXn-2, an emission signal OFGn, and a select signal SELn are transmitted to each nth (n being an integer) row after the second row.

Figure 9:
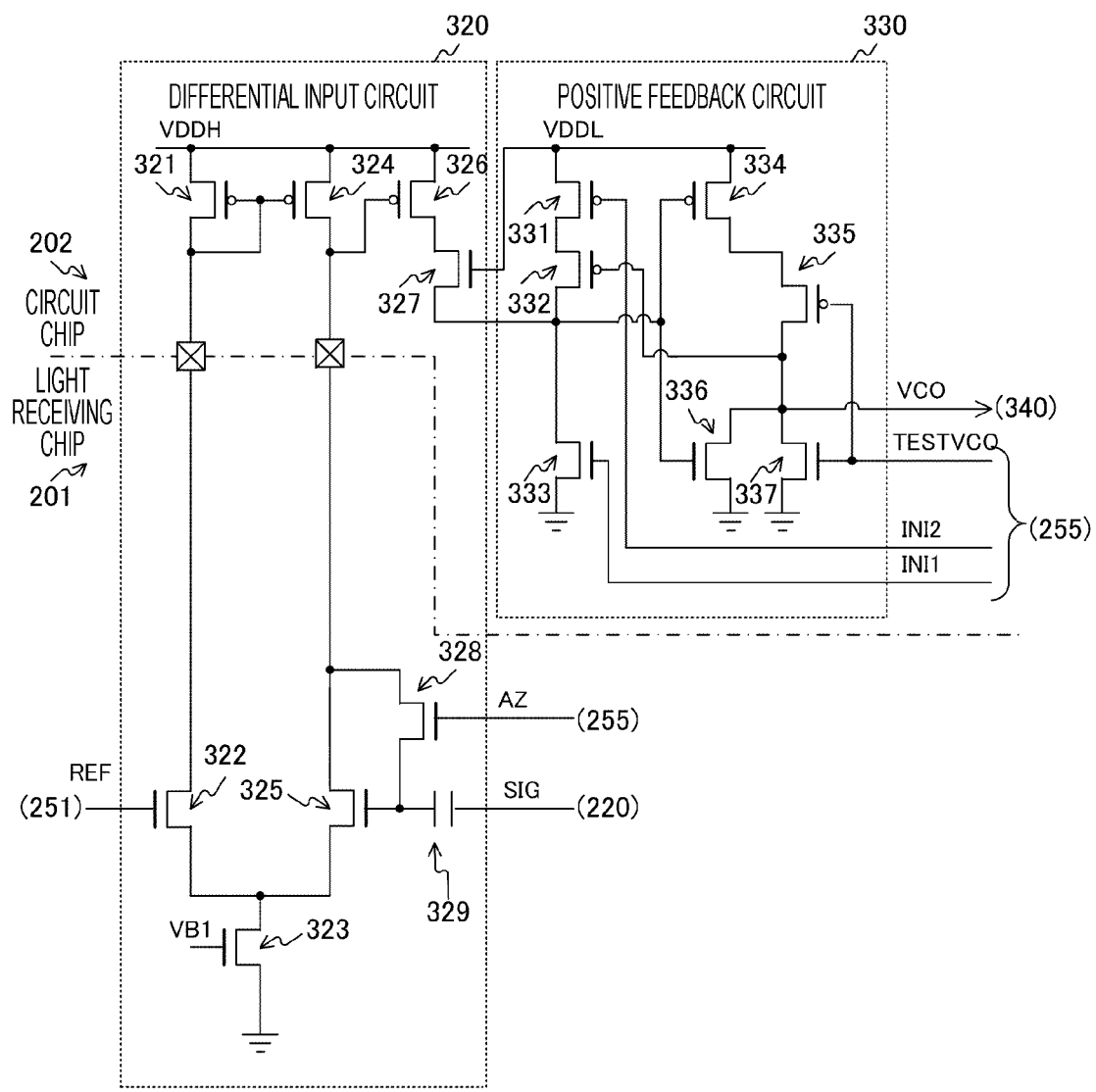
FIG. 9 is a circuit diagram showing an example configuration of a differential input circuit and a positive feedback circuit according to the first embodiment of the present technology.

FIG. 9 is a circuit diagram showing an example configuration of a differential input circuit 320 and a positive feedback circuit 330 according to the first embodiment of the present technology.

The differential input circuit 320 includes p-channel MOS (pMOS) transistors 321, 324, and 326, nMOS transistors 322, 323, 325, 327, and 328, and a capacitor 329. Of these components, the nMOS transistors 322, 323, 325, and 328, and the capacitor 329 are disposed in the light receiving chip 201, and the remaining components are disposed in the circuit chip 202.

The nMOS transistors 322 and 325 form a differential pair, and the sources of these transistors are both connected to the drain of the nMOS transistor 323. Further, the drain of the nMOS transistor 322 is connected to the drain of the pMOS transistor 321 and the gates of the pMOS transistors 321 and 324. The drain of the nMOS transistor 325 is connected to the drain of the pMOS transistor 324 and the gate of the pMOS transistor 326. Further, a reference signal REF from the DAC 251 is input to the gate of the nMOS transistor 322.

A pixel signal SIG from the analog TDI circuit 220 is input to the gate of the nMOS transistor 325 via the capacitor 329. Further, the source and the drain of the nMOS transistor 328 are connected to the gate and the drain of the nMOS transistor 325. An autozero signal AZ from the vertical scanning circuit 255 is input to the gate of the nMOS transistor 328.

A predetermined bias voltage VB1 is applied to the gate of the nMOS transistor 323, and a predetermined ground voltage is applied to the source of the nMOS transistor 323.

The pMOS transistors 321, 324, and 326 constitute a current mirror circuit. A power supply voltage VDDH is applied to the sources of the pMOS transistors 321, 324, and 326. The power supply voltage VDDH is higher than a power supply voltage VDDL described later.

The power supply voltage VDDL is applied to the gate of the nMOS transistor 327. Further, the drain of the nMOS transistor 327 is connected to the drain of the pMOS transistor 326, and the source is connected to the positive feedback circuit 330.

The positive feedback circuit 330 includes pMOS transistors 331, 332, 334, and 335 and nMOS transistors 333, 336, and 337. The pMOS transistors 331 and 332, and the nMOS transistor 333 are connected in series to the power supply voltage VDDL. Further, a drive signal INI2 from the vertical scanning circuit 255 is input to the gate of the pMOS transistor 331. The connecting point between the pMOS transistor 332 and the nMOS transistor 333 is connected to the source of the nMOS transistor 327.

The ground voltage is applied to the source of the nMOS transistor 333, and a drive signal INI1 from the vertical scanning circuit 255 is input to the gate thereof.

The pMOS transistors 334 and 335 are connected in series to the power supply voltage VDDL. Further, the drain of the pMOS transistor 335 is connected to the gate of the pMOS transistor 332 and the drains of the nMOS transistors 336 and 337. A control signal TESTVCO from the vertical scanning circuit 255 is input to the gates of the pMOS transistor 335 and the nMOS transistor 337. Further, the gates of the pMOS transistor 334 and the nMOS transistor 336 are connected to the connecting point between the pMOS transistor 332 and the nMOS transistor 333.

The output signal VCO is output from the connecting point between the pMOS transistor 335 and the nMOS transistor 337. Further, the ground voltage is applied to the sources of the nMOS transistors 336 and 337.

Note that the differential input circuit 320 and the positive feedback circuit 330 are not limited to the respective circuits shown in FIG. 9, as long as they have the functions described with reference to FIG. 7.

Example Configuration of the Signal Processing Circuit

Figure 10:
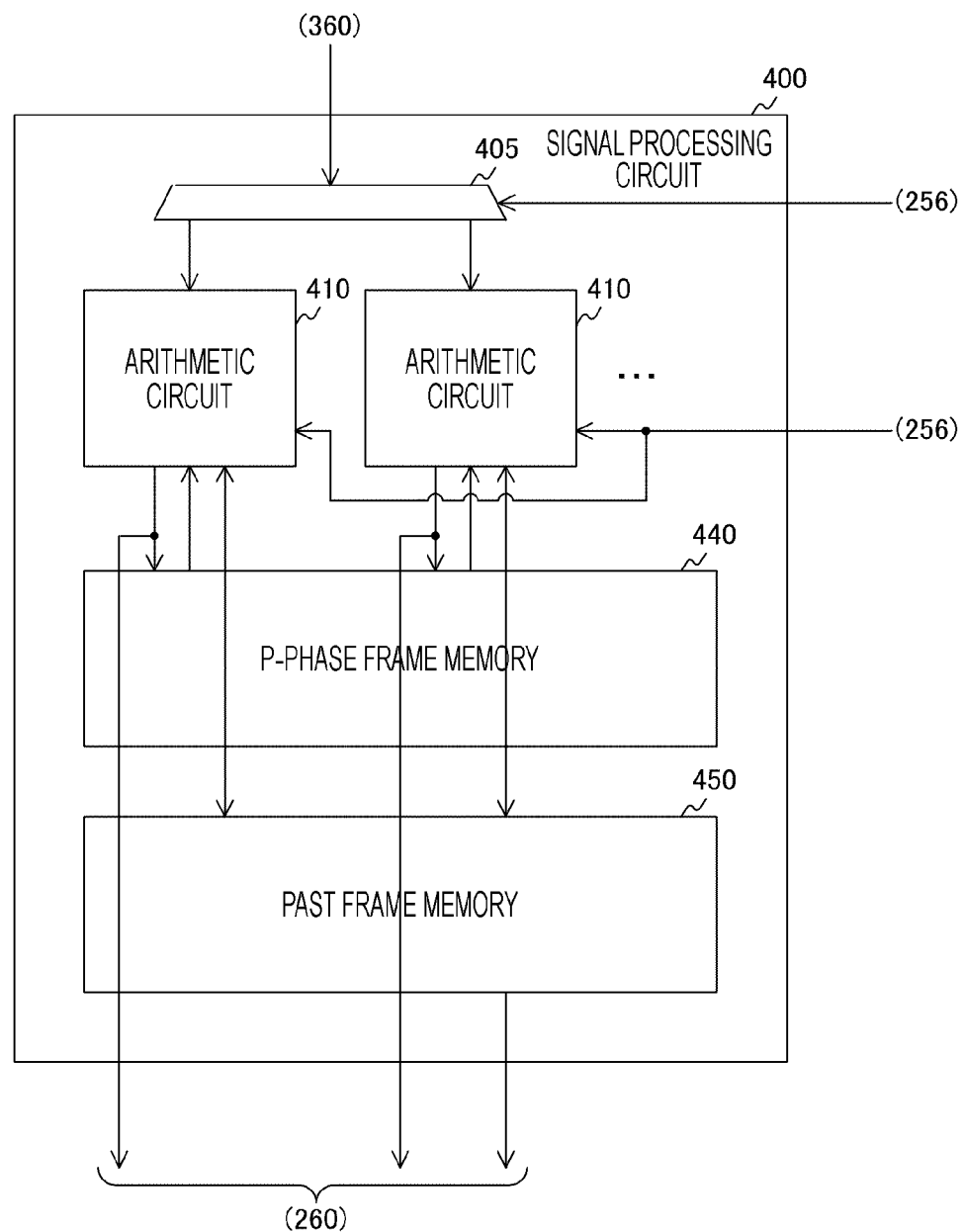
FIG. 10 is a block diagram showing an example configuration of a signal processing circuit according to the first embodiment of the present technology.

FIG. 10 is a block diagram showing an example configuration of the signal processing circuit 400 according to the first embodiment of the present technology. The signal processing circuit 400 includes a plurality of selectors 405, a plurality of arithmetic circuits 410, a P-phase frame memory 440, and a past frame memory 450.

A selector 405 is provided for each column of clusters 300, or for each repeater unit 360. In a case where two columns of ADCs 310 are provided in a cluster 300, a selector 405 is provided for each two columns. Meanwhile, an arithmetic circuit 410 is provided for each column of ADCs 310. In a case where the ADCs 310 are arranged in M columns, M/2 selectors 405 and M arithmetic circuits 410 are provided.

As described above, the repeater units 360 sequentially output digital signals in the odd-numbered columns and digital signals in the even-numbered columns.

A selector 405 selects an output destination of a digital signal, under the control of the control circuit 256. In a case where an odd-numbered column is output by the repeater unit 360, the selector 405 outputs digital signals to the arithmetic circuit 410 corresponding to the odd-numbered column. On the other hand, in a case where an even-numbered column is output, the selector 405 outputs digital signals to the arithmetic circuit 410 corresponding to the even-numbered column.

The arithmetic circuits 410 perform a CDS process and a digital TDI process on the digital signals from the selectors 405.

Here, digital signals include P-phase levels and D-phase levels. A P-phase level indicates the level at a time when a pixel is initialized by the reset signal RST. On the other hand, a D-phase level indicates the level corresponding to the exposure amount when electric charges are transferred by a transfer signal. The P-phase levels are also called reset levels, and the D-phase levels are also called signal levels.

In the CDS process, the M arithmetic circuits 410 cause the P-phase frame memory 440 to hold a P-phase frame in which P-phase levels are arranged. The M arithmetic circuits 410 then calculate the difference between the P-phase level and the D-phase level for each pixel, and generate a current frame that is a CDS frame in which difference data is provided.

In the digital TDI process, the M arithmetic circuits 410 then cause the past frame memory 450 to hold the CDS frame as a past frame. Next, the M arithmetic circuits 410 add the line of a predetermined address in the CDS frame subjected to the CDS process, and the line of an address adjacent to the predetermined address in the past frame that is two frames older.

The M arithmetic circuits 410 also supply the CDS frame, and the TDI frame subjected to the digital TDI process, to the image processing circuit 260.

Figure 11:
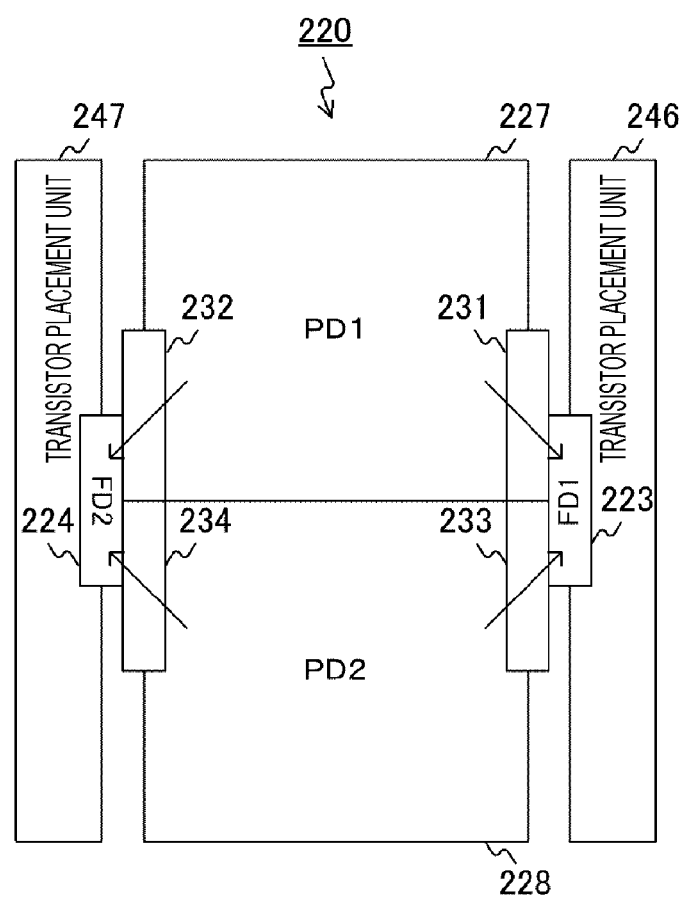
FIG. 11 is a diagram showing an example layout of the elements in an analog TDI circuit according to the first embodiment of the present technology.

FIG. 11 is a diagram showing an example layout of the elements in an analog TDI circuit 220 according to the first embodiment of the present technology. The photoelectric conversion elements 227 and 228 are aligned in the vertical direction, and the floating diffusion layers 223 and 224 are aligned in the horizontal direction. The transfer transistors 232 and 234 are disposed between the floating diffusion layer 224 and the photoelectric conversion elements 227 and 228. Meanwhile, the transfer transistors 231 and 233 are disposed between the floating diffusion layer 223 and the photoelectric conversion elements 227 and 228. Arrows in the drawing indicate charge transfer directions.

Here, the photoelectric conversion element 227 is disposed in the kth (k being an odd number) row, which is an odd-numbered row, and the photoelectric conversion element 228 is disposed in the (k+1)th row, which is an even-numbered row, for example. Further, the photoelectric conversion element 227 in the 2kth row is denoted by "PDk", and the photoelectric conversion element 228 in the (k+1)th row is denoted by "PD(k+1)". One of the floating diffusion layers 223 and 224 corresponding to the kth and (k+1)th rows is "FDk", and the other is "FD(k+1)". In a case where k is "1", "PD1" is disposed in the first row, and "PD2" is disposed in the second row. Also, "FD1" and "FD2" are disposed in the first and second rows.

Further, a rectangular transistor placement unit 247 is disposed on the left side of the floating diffusion layer 224, and a rectangular transistor placement unit 246 is disposed on the right side of the floating diffusion layer 223. In the transistor placement unit 246, the reset transistor 221, the charge emission transistor 225, the amplification transistor 241, and the select transistor 243 in the circuit shown in FIG. 8 are disposed, for example. In the transistor placement unit 247, the reset transistor 222, the charge emission transistor 226, the amplification transistor 242, the select transistor 244, and the current source transistor 245 in the circuit shown in FIG. 8 are disposed, for example.

Figure 12A:
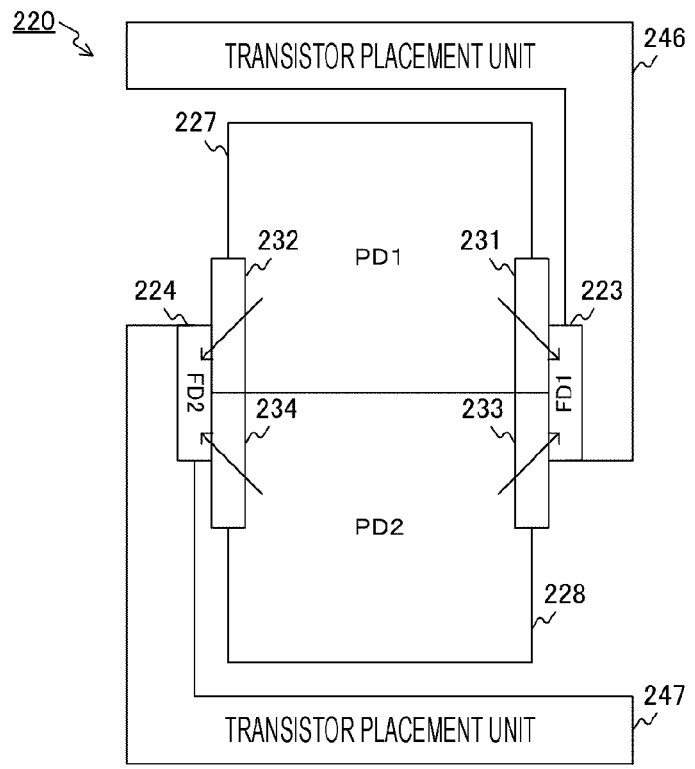
FIGS. 12A and 12B are diagrams showing other example layouts of the elements in an analog TDI circuit according to the first embodiment of the present technology.
Figure 12B:
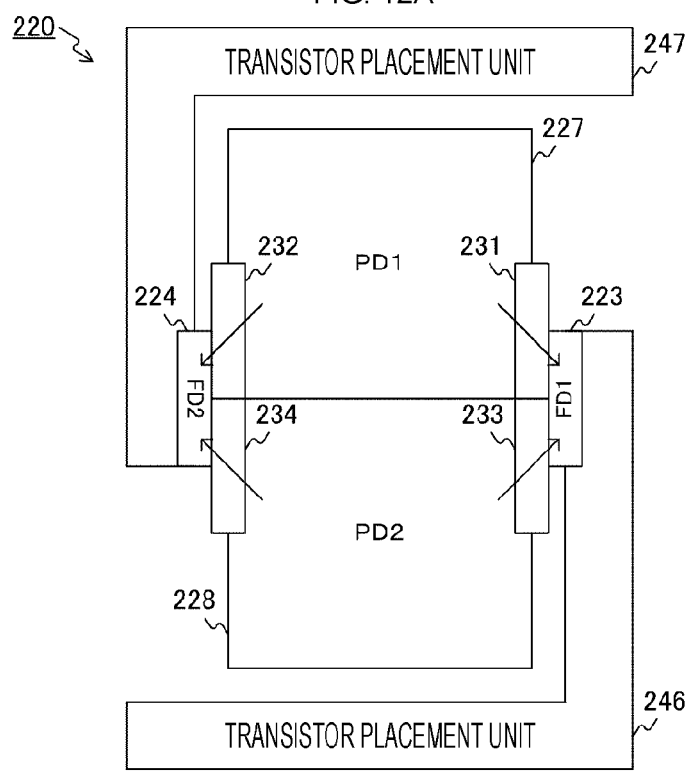

FIGS. 12A and 12B are diagrams showing other example layouts of the elements in an analog TDI circuit 220 according to the first embodiment of the present technology. As shown in the drawing, the transistor placement units 246 and 247 may be L-shaped structures. In the drawing, FIG. 12A shows an example layout in which the transistor placement unit 246 is disposed on the upper side, and the transistor placement unit 247 is disposed on the lower side. In the drawing, FIG. 12B shows an example layout in which the transistor placement unit 246 is disposed on the lower side, and the transistor placement unit 247 is disposed on the upper side.

Example Operations of the Solid-State Imaging Device

Figure 13:
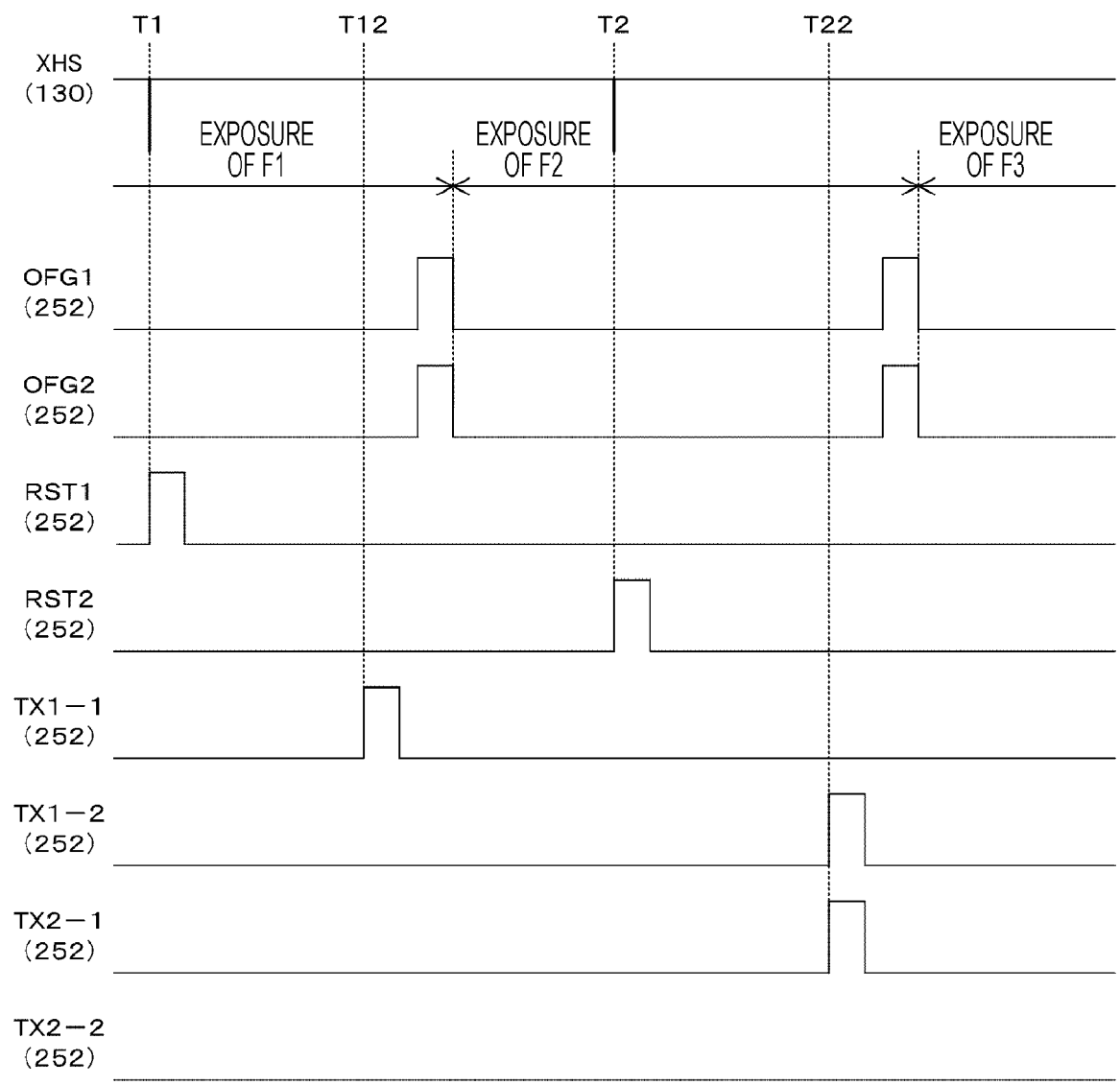
FIG. 13 is a timing chart showing an example of transistor control according to the first embodiment of the present technology.

FIG. 13 is a timing chart showing an example of transistor control according to the first embodiment of the present technology. The pixel drive circuit 252 starts exposure of all the pixels with the emission signals OFG at a timing synchronized with the synchronization signal XHS. The timing to end the exposure of all the pixels is immediately before the start of the next exposure. For example, the first exposure ends at a timing between timing T1 and timing T2, and the first frame F1 is generated. Further, the second exposure is started after the end of the first exposure. The second exposure then ends at a timing after timing T22, and the second frame F2 is generated. Also, the third exposure is started immediately after the end of the second exposure.

Meanwhile, at timing T1, the pixel drive circuit 252 initializes FD1 of the first row with the reset signal RST1. Further, at timing T12 immediately before the end of the exposure, the pixel drive circuit 252 transfers electric charges from PD1 to FD1 with the transfer signal TX1-1.

Next, at timing T2 after the end of the exposure of the frame F1, the pixel drive circuit 252 initializes FD1 of the second row with the reset signal RST2. Further, at timing T22 before the end of the exposure, the pixel drive circuit 252 transfers electric charges from PD1 to FD2 and transfers electric charges from PD2 to FD1, with the transfer signals TX1-2 and TX2-1.

As shown in the drawing, exposure is started with the emission signals OFG, and the floating diffusion layers (FD1 and FD2) are initialized with the reset signals RST.

Figure 14:
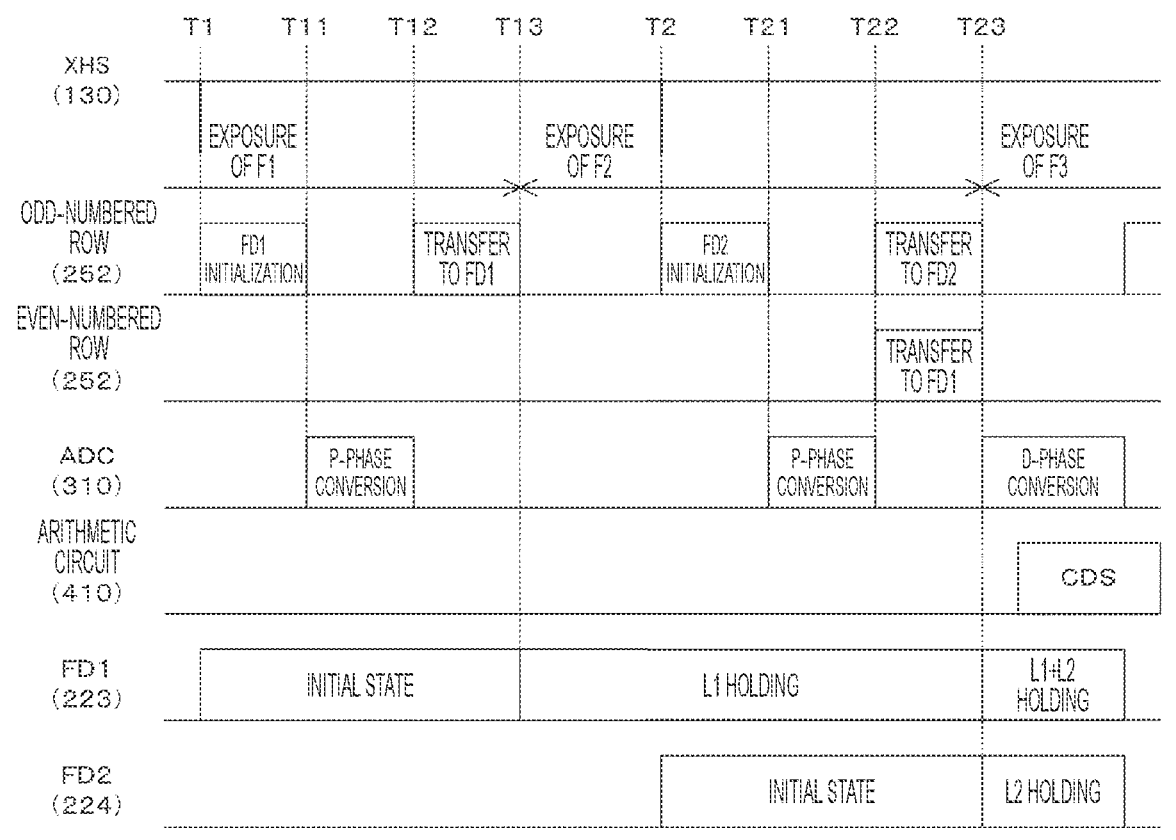

FIG. 14 is a timing chart showing an example operation of the solid-state imaging device 200 until the end of the exposure of the second frame according to the first embodiment of the present technology.

At timing T1 when the synchronization signal XHS falls after the start of the exposure of the frame F1, the pixel drive circuit 252 initializes FD1 with the reset signal RST1. Also, the autozero signal AZ is input to the differential input circuit 320. At timing T11 immediately after the initialization, the select signal SEL1 is then transmitted, and the ADC 310 converts the P-phase level of FD1 into a digital signal. Next, at timing T12 immediately before the end of the exposure, the pixel drive circuit 252 transfers electric charges from PD1 to FD1 with the transfer signal TX1-1. As a result of the transfer of electric charges, FD1 shifts from the initial state to a state in which it holds the electric charges corresponding to the exposure amount in a line L1. Here, the line L1 is the line of the first row, which is an odd-numbered row.

At timing T2 when the synchronization signal XHS falls after the start of the exposure of the frame F2, the pixel drive circuit 252 then initializes FD2 with the reset signal RST1. Also, the autozero signal AZ is input to the differential input circuit 320. At timing T21 immediately after the initialization, the select signal SEL2 is then transmitted, and the ADC 310 converts the P-phase level of FD2 of the frame F2 into a digital signal.

Next, at timing T22 immediately before the end of the exposure, the pixel drive circuit 252 transfers electric charges from PD1 to FD2 and transfers electric charges from PD2 to FD1, with the transfer signals TX1-2 and TX2-1. As a result of these transfers, FD1 shifts to a state in which it holds the electric charges corresponding to the respective exposure amounts in the line L1 of the frame F1 and a line L2 of the frame F2. Here, the line L2 is the line of the second row, which is an even-numbered row. On the other hand, FD2 shifts from the initial state to a state in which it holds the electric charges corresponding to the exposure amount in the line L2. As shown in the example in the drawing, in FD1, the charge amounts in the line L1 of the frame F1 and the line L2 of the frame F2 are integrated, and thus, an analog TDI process is successfully performed.

FIG. 15 is a timing chart showing an example operation of the solid-state imaging device until the initialization of the floating diffusion layers of the fourth frame according to the first embodiment of the present technology.

At timing T23 when the exposure of a frame F3 is started, the select signal SEL1 is transmitted, and the ADC 310 performs AD conversion on the D-phase level in the line obtained by integrating the line L1 of the frame F1 and the line L2 of the frame F2. Meanwhile, the arithmetic circuit 410 performs a CDS process to calculate the difference between the D-phase level and the P-phase level of FD1 of the frame F1.

At timing T3 when the synchronization signal XHS falls after the start of the exposure of the frame F3, the pixel drive circuit 252 initializes FD1 with the reset signal RST1. Also, the autozero signal AZ is input to the differential input circuit 320. At timing T31 immediately after the initialization, the select signal SEL1 is then transmitted, and the ADC 310 converts the P-phase level of FD1 of the frame F3 into a digital signal.

Next, at timing T32 immediately before the end of the exposure, the pixel drive circuit 252 transfers electric charges from PD1 to FD1 and transfers electric charges from PD2 to FD2, with the transfer signals TX1-1 and TX2-2. As a result of these transfers, FD1 shifts from the initial state to a state in which it holds the line L1 of the frame F3, and FD2 shifts to a state in which it holds the electric charges corresponding to the respective exposure amounts in the line L1 of the frame F2 and the line L2 of the frame F3.

At timing T33 when the exposure of a frame F4 is started, the select signal SEL2 is transmitted, and the ADC 310 performs AD conversion on the D-phase level in the line obtained by integrating the line L1 of the frame F2 and the line L2 of the frame F3. Meanwhile, the arithmetic circuit 410 performs a CDS process to calculate the difference between the D-phase level and the P-phase level of FD2 of the frame F2.

At timing T4 when the synchronization signal XHS falls after the start of the exposure of the frame F4, the pixel drive circuit 252 initializes FD2 with the reset signal RST2. Also, the autozero signal AZ is input to the differential input circuit 320.

Note that, after the exposure of the frame F3, transfer of electric charges is also performed in parallel for the third and later rows, but the control on the third and later rows is not shown.

Figure 16:
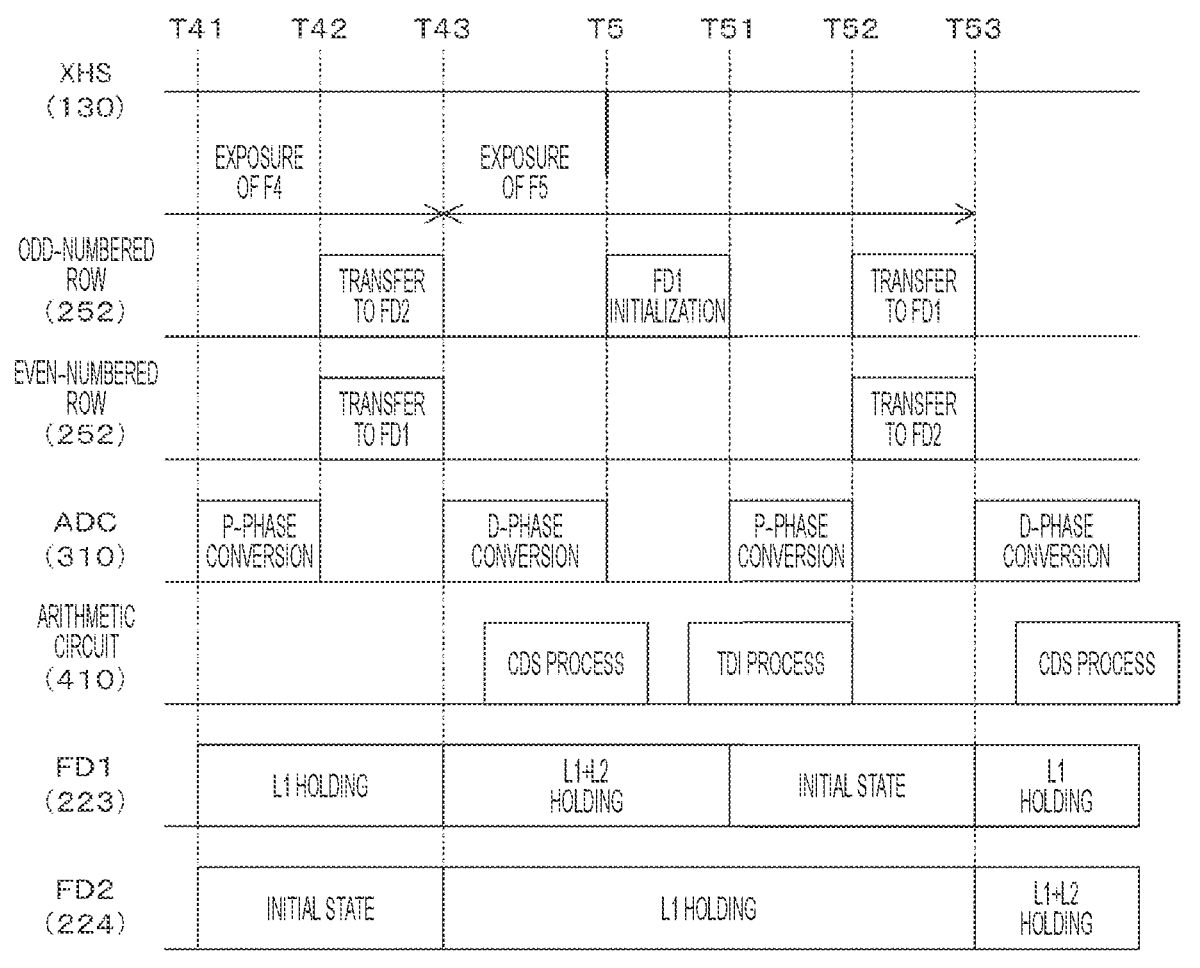

FIG. 16 is a timing chart showing an example operation of the solid-state imaging device 200 until the end of the exposure of the fifth frame according to the first embodiment of the present technology.

At timing T41 immediately after the initialization, the select signal SEL2 is transmitted, and the ADC 310 converts the P-phase level of FD2 of the frame F4 into a digital signal.

Next, at timing T42 immediately before the end of the exposure, the pixel drive circuit 252 transfers electric charges from PD1 to FD2 and transfers electric charges from PD2 to FD1, with the transfer signals TX1-2 and TX2-1. As a result of these transfers, FD1 shifts to a state in which it holds the electric charges corresponding to the respective exposure amounts in the line L1 of the frame F3 and the line L2 of the frame F4. On the other hand, FD2 shifts from the initial state to a state in which it holds the line L1 of the frame F4.

At timing T43 when the exposure of a frame F5 is started, the select signal SEL1 is transmitted, and the ADC 310 performs AD conversion on the D-phase level in the line obtained by integrating the line L1 of the frame F3 and the line L2 of the frame F4. Meanwhile, the arithmetic circuit 410 performs a CDS process to calculate the difference between the D-phase level and the P-phase level of FD1 of the frame F3.

At timing T5 when the synchronization signal XHS falls after the start of the exposure of the frame F5, the pixel drive circuit 252 initializes FD1 with the reset signal RST1. Also, the autozero signal AZ is input to the differential input circuit 320. At timing T51 immediately after the initialization, the select signal SEL1 is then transmitted, and the ADC 310 converts the P-phase level of FD1 of the frame F5 into a digital signal. Meanwhile, the arithmetic circuit 410 performs a digital TDI process to integrate the line L1 of the frame F1, the line L2 of the frame F2, the line L3 of the frame F3, and the line L4 of the frame F4.

Next, at timing T52 immediately before the end of the exposure, the pixel drive circuit 252 transfers electric charges from PD1 to FD1 and transfers electric charges from PD2 to FD2, with the transfer signals TX1-1 and TX2-2. As a result of these transfers, FD1 shifts from the initial state to a state in which it holds the line L1 of the frame F5, and FD2 shifts to a state in which it holds the electric charges corresponding to the respective exposure amounts in the line L1 of the frame F4 and the line L2 of the frame F5.

At timing T53 when the exposure of the frame F5 is finished, the select signal SEL2 is transmitted, and the ADC 310 performs AD conversion on the D-phase level in the line obtained by integrating the line L1 of the frame F4 and the line L2 of the frame F5. Meanwhile, the arithmetic circuit 410 performs a CDS process to calculate the difference between the D-phase level and the P-phase level of FD2 of the frame F4.

Next, the states of the analog TDI circuit 220 at the respective points of time in the timing charts shown in FIGS. 14 to 16 will be described.

Figure 17A:
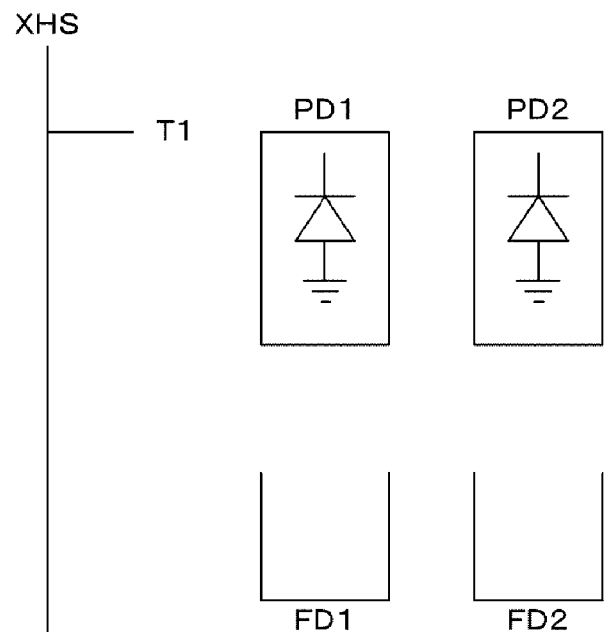
FIGS. 17A and 17B are diagrams showing an example of the states of an analog TDI circuit until the end of exposure of the first frame according to the first embodiment of the present technology.
Figure 17B:
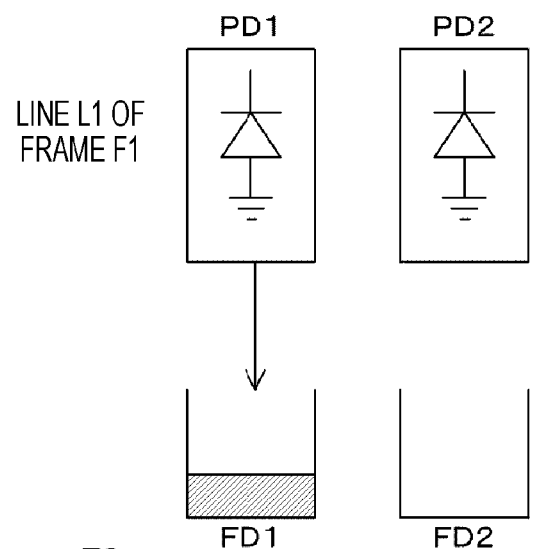

FIGS. 17A and 17B are diagrams showing an example of the states of the analog TDI circuit 220 until the end of exposure of the first frame according to the first embodiment of the present technology. In the drawing, FIG. 17A shows an example of the state of the analog TDI circuit 220 at timing T1, and FIG. 17B shows an example of the state of the analog TDI circuit 220 at the end of the exposure of the frame F1.

As shown in FIG. 17A in the drawing, the pixel drive circuit 252 initializes FD1 at timing T1. As shown in FIG. 17B in the drawing, the pixel drive circuit 252 then transfers electric charges from PD1 to FD1 at the end of the exposure of the frame F1. As a result, the electric charges corresponding to the exposure amount in the line L1 of the frame F1 are held in FD1.

Figure 18A:
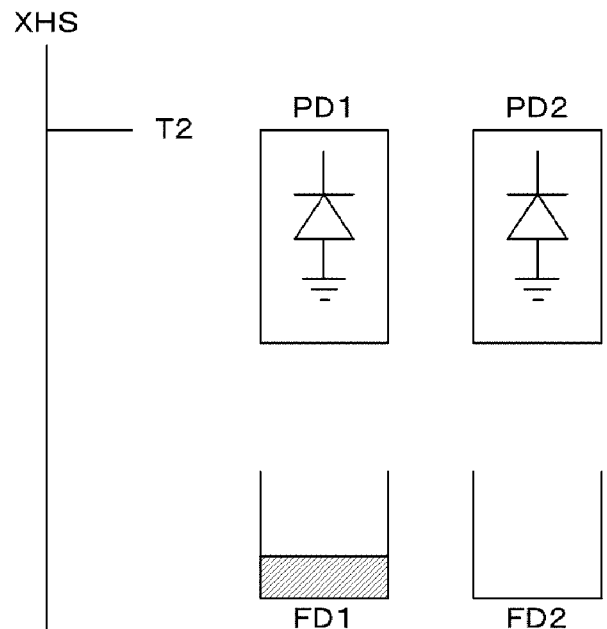
FIGS. 18A and 18B are diagrams showing an example of the states of the analog TDI circuit until the end of exposure of the second frame according to the first embodiment of the present technology.
Figure 18B:
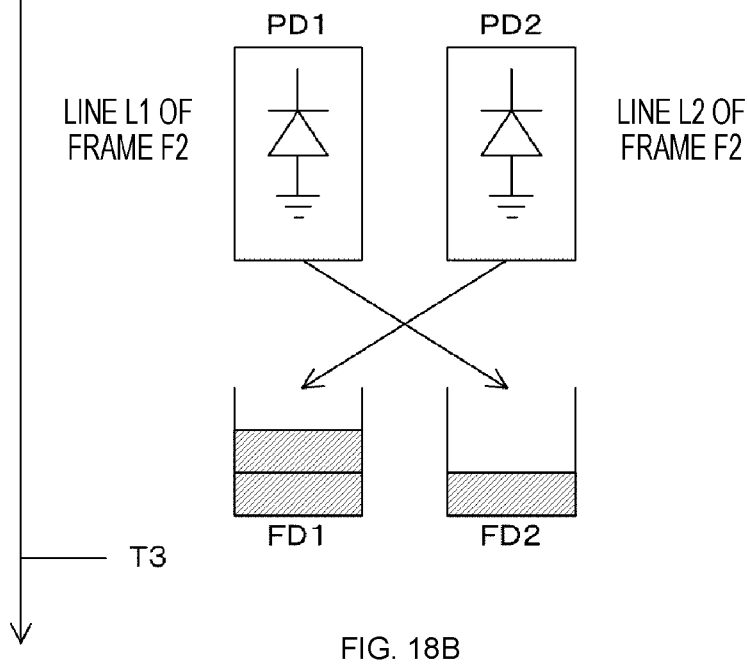

FIGS. 18A and 18B are diagrams showing an example of the states of the analog TDI circuit 220 until the end of exposure of the second frame according to the first embodiment of the present technology. In the drawing, FIG. 18 A shows an example of the state of the analog TDI circuit 220 at timing T2, and FIG. 18B shows an example of the state of the analog TDI circuit 220 at the end of the exposure of the frame F2.

As shown in FIG. 18A in the drawing, the pixel drive circuit 252 initializes FD2 at timing T2. As shown in FIG.

18B in the drawing, at the end of the exposure of the frame F2, the pixel drive circuit 252 then transfers electric charges from PD1 to FD2 and transfers electric charges from PD2 to FD1. As a result, the electric charges corresponding to the respective exposure amounts in the line L1 of the frame F1 and the line L2 of the frame F2 are held in FD1. Meanwhile, the electric charges corresponding to the exposure amount in the line L1 of the frame F2 are held in FD2.

Figure 19A:
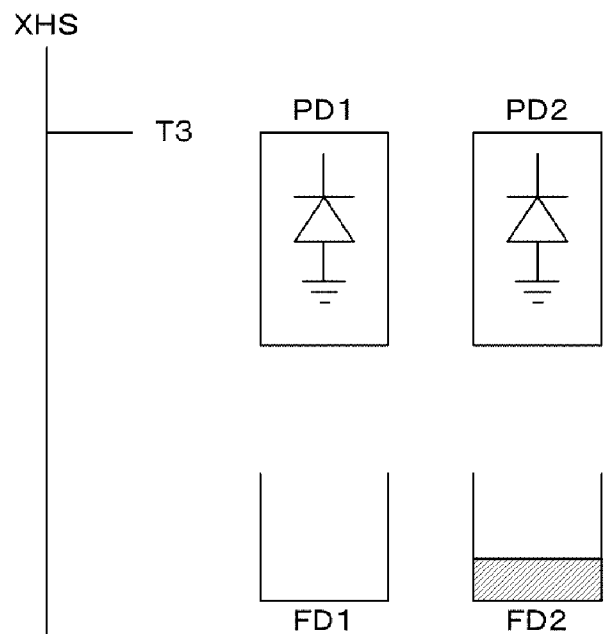
FIGS. 19A and 19B are diagrams showing an example of the states of the analog TDI circuit until the end of exposure of the third frame according to the first embodiment of the present technology.
Figure 19B:
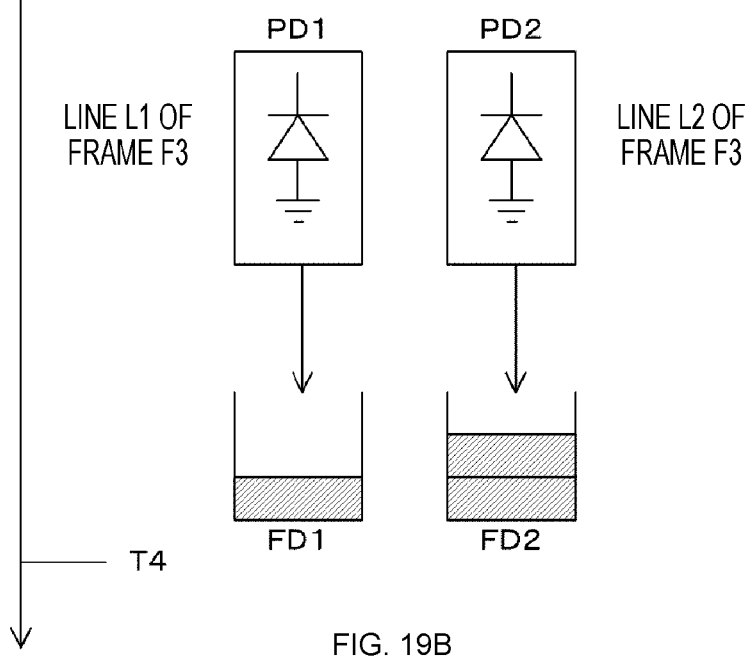

FIGS. 19A and 19B are diagrams showing an example of the states of the analog TDI circuit 220 until the end of exposure of the third frame according to the first embodiment of the present technology. In the drawing, FIG. 19A shows an example of the state of the analog TDI circuit 220 at timing T3, and FIG. 19B shows an example of the state of the analog TDI circuit 220 at the end of the exposure of the frame F3.

As shown in FIG. 19A in the drawing, the pixel drive circuit 252 initializes FD1 at timing T3. As shown in FIG. 19B in the drawing, at the end of the exposure of the frame F3, the pixel drive circuit 252 then transfers electric charges from PD1 to FD1 and transfers electric charges from PD2 to FD2. As a result, the electric charges corresponding to the exposure amount in the line L1 of the frame F3 are held in FD1. Meanwhile, in FD2, the electric charges corresponding to the respective exposure amounts in the line L1 of the frame F2 and the line L2 of the frame F3 are held in FD1.

Figure 20A:
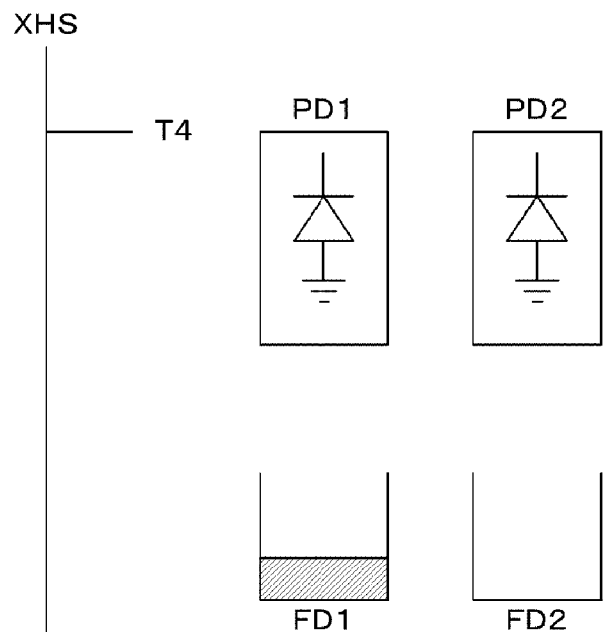
FIGS. 20A and 20B are diagrams showing an example of the states of the analog TDI circuit until the end of exposure of the fourth frame according to the first embodiment of the present technology.
Figure 20B:
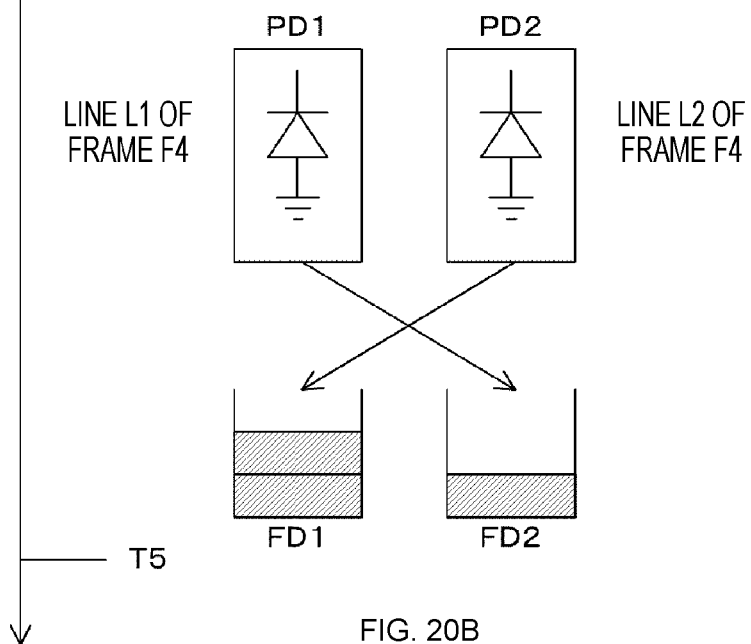

FIGS. 20A and 20B are diagrams showing an example of the states of the analog TDI circuit 220 until the end of exposure of the fourth frame according to the first embodiment of the present technology. In the drawing, FIG. 20A shows an example of the state of the analog TDI circuit 220 at timing T4, and FIG. 20B shows an example of the state of the analog TDI circuit 220 at the end of the exposure of the frame F4.

As shown in FIG. 20A in the drawing, the pixel drive circuit 252 initializes FD2 at timing T4. As shown in FIG. 20B in the drawing, at the end of the exposure of the frame F4, the pixel drive circuit 252 then transfers electric charges from PD1 to FD2 and transfers electric charges from PD2 to FD1. As a result, the electric charges corresponding to the respective exposure amounts in the line L1 of the frame F3 and the line L2 of the frame F4 are held in FD1. Meanwhile, the electric charges corresponding to the exposure amount in the line L1 of the frame F4 are held in FD2.

Figure 21A:
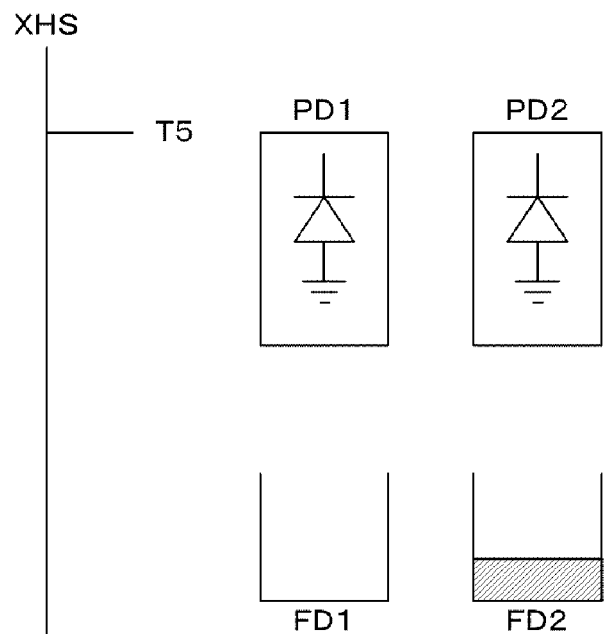
FIGS. 21A and 21B are diagrams showing an example of the states of the analog TDI circuit until the end of exposure of the fifth frame according to the first embodiment of the present technology.
Figure 21B:
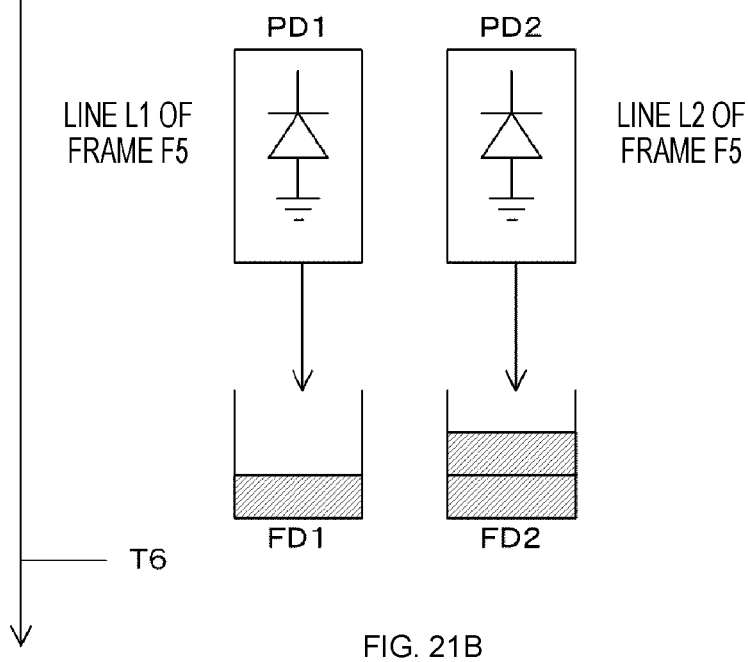

FIGS. 21A and 21B are diagrams showing an example of the states of the analog TDI circuit 220 until the end of exposure of the fifth frame according to the first embodiment of the present technology. In the drawing, FIG. 21A shows an example of the state of the analog TDI circuit 220 at timing T5, and FIG. 21B shows an example of the state of the analog TDI circuit 220 at the end of the exposure of the frame F5.

As shown in FIG. 21A in the drawing, the pixel drive circuit 252 initializes FD1 at timing T5. As shown in FIG. 21B in the drawing, at the end of the exposure of the frame F5, the pixel drive circuit 252 then transfers electric charges from PD1 to FD1 and transfers electric charges from PD2 to FD2. As a result, the electric charges corresponding to the exposure amount in the line L1 of the frame F5 are held in FD1. Meanwhile, in FD2, the electric charges corresponding to the respective exposure amounts in the line L1 of the frame F4 and the line L2 of the frame F5 are held in FD1.

Here, a configuration in which one of FD1 and FD2, and the two transfer transistors that transfer electric charges to the one are eliminated from an analog TDI circuit is described as a comparative example.

Figure 22A:
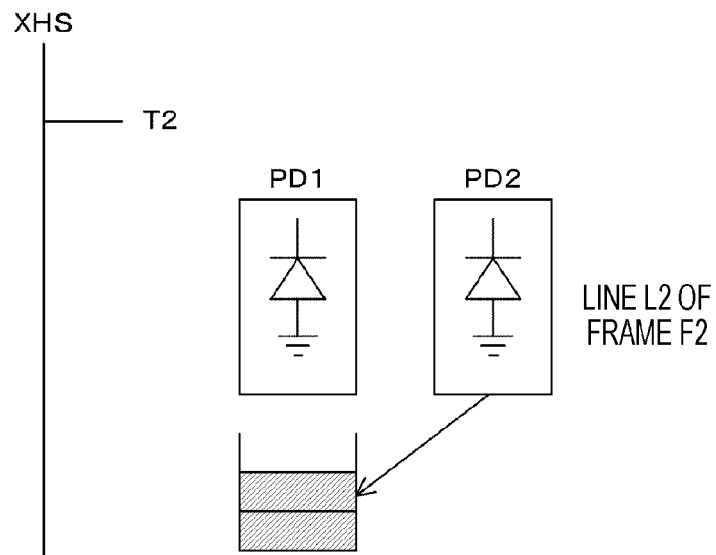
FIGS. 22A, 22B, and 22C are diagrams showing an example of the states of an analog TDI circuit until the end of exposure of the second frame in a comparative example.
Figure 22B:
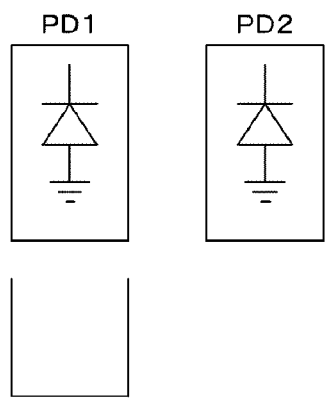
Figure 22C:
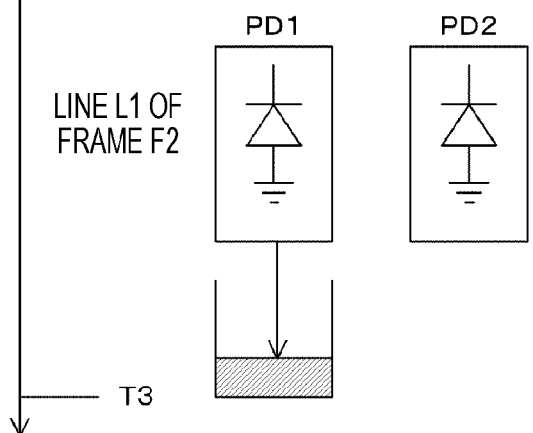

FIGS. 22A, 22B, and 22C are diagrams showing an example of the states of an analog TDI circuit until the end of exposure of the second frame in the comparative example. In the drawing, FIG. 22A shows an example of the state of the analog TDI circuit 220 at timing T2, and FIG. 22B shows the state of the analog TDI circuit in which FD is initialized. In the drawing, FIG. 22C shows an example of the state of the analog TDI circuit at the end of exposure of the frame F2.

In the comparative example in which PD1 and PD2 share one FD, the pixel drive circuit 252 of the comparative example transfers electric charges from PD2 to FD, as shown as an example in FIG. 22A in the drawing. As a result, the electric charges corresponding to the respective exposure amounts in the line L1 of the frame F1 and the line L2 of the frame F2 are held in FD. The D-phase level of the line obtained by integrating these lines is then converted into a digital signal.

The pixel drive circuit 252 of the comparative example then initializes FD as shown in FIG. 22B in the drawing. When the P-phase level is converted into a digital signal, electric charges are transferred from PD1 to FD, as shown in FIG. 22C in the drawing. As a result, the electric charges corresponding to the exposure amount in the line L1 of the frame F2 are held in FD.

As shown in the drawing, in the comparative example in which there is only one FD for PD1 and PD2, the charge transfer from the line L2 of the frame F2 and the charge transfer from the line L1 of the frame F2 cannot be performed at the same time. These charge transfers are sequentially performed, with resetting of FD being interposed in between.

In an analog TDI circuit 220 provided with FD1 and FD2, on the other hand, the charge transfer from the line L2 of the frame F2 and the charge transfer from the line L1 of the frame F2 can be performed at the same time, as shown in FIG. 18B. Accordingly, it is possible to start the next charge transfer, without waiting for the initialization of FD. Thus, the intervals of the synchronization signal XHS can be made shorter than that in the comparative example. As one line of a TDI frame is scanned in synchronization with the synchronization signal XHS, it is possible to improve the scanning speed of the TDI frame, which is the scan rate, by shortening the intervals of the synchronization signal XHS. Further, the speed of the AD conversion to be performed in synchronization with the synchronization signal XHS can be improved.

Figure 23:
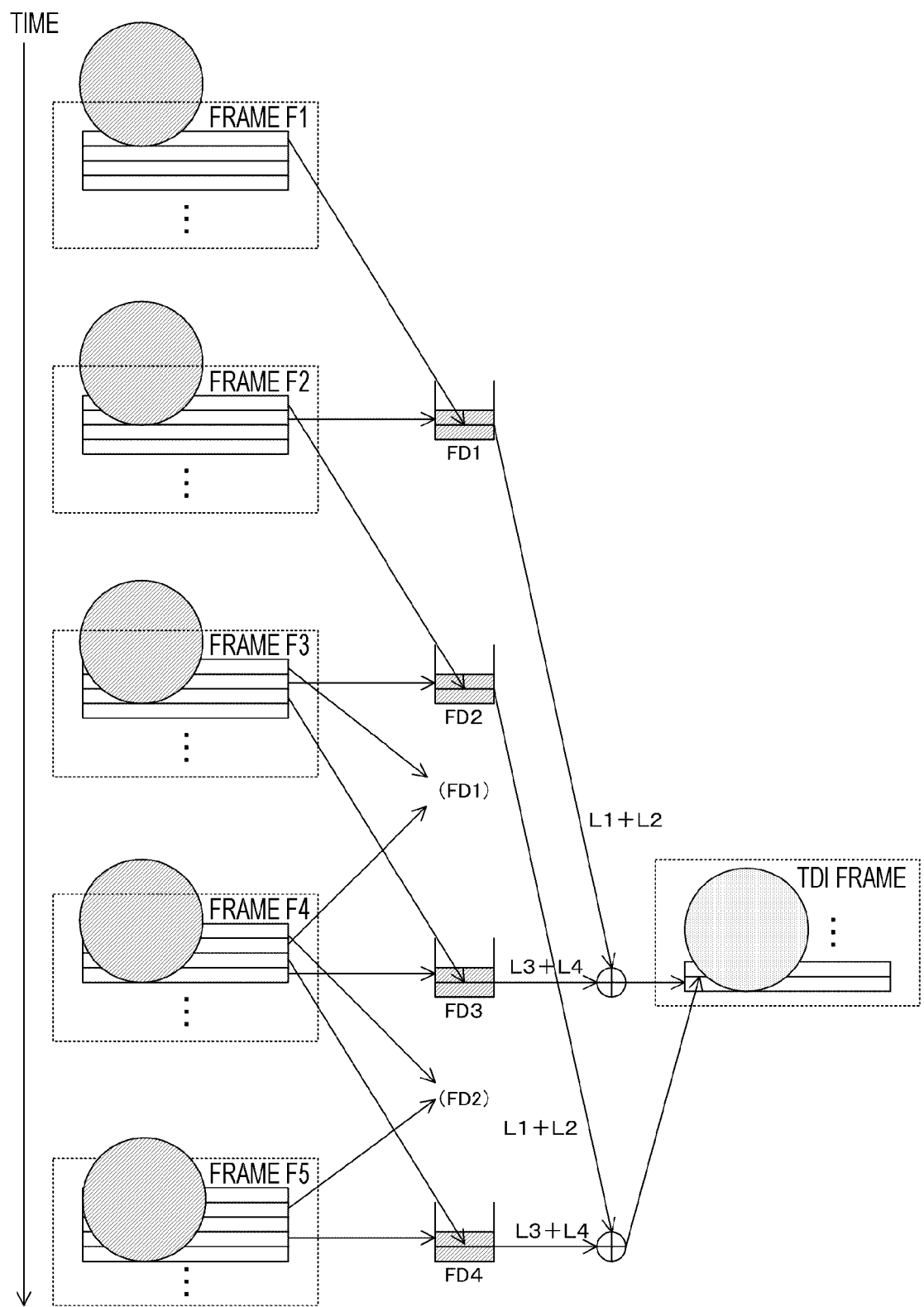
FIG. 23 is a diagram showing an example of a TDI process according to the first embodiment of the present technology.

FIG. 23 is a diagram showing an example of a TDI process according to the first embodiment of the present technology. For example, the frame F1 is first imaged, followed by the frames F2, F3, F4, and F5 in this order. Arrows in the drawing indicate the moving directions of the object. As shown in the example in the drawing, the object moves line by line in the vertical direction.

The analog TDI circuit 220 initializes FD1, and transfers the electric charges in the line L1 of the frame F1 to FD1. Next, the analog TDI circuit 220 transfers the electric charges in the line L2 of the frame F2 to FD1, and transfers the electric charges in the line L1 of the frame F2 to FD2. The electric charges in the line L1+L2 are held in FD1, and the voltage corresponding to the charge amount is converted into a digital signal.

Next, the analog TDI circuit 220 initializes FD1 and FD3, transfers the electric charges in the line L2 of the frame F3 to FD2, and transfers the electric charges in the line L1 of the frame F3 to FD1. At the same time, the analog TDI circuit 220 transfers the electric charges in the line L3 of the frame F3 to FD3. The electric charges in the line L1+L2 are held in FD2, and the voltage corresponding to the charge amount is converted into a digital signal.

The analog TDI circuit 220 then initializes FD2 and FD4, transfers the electric charges in the line L2 of the frame F4 to FD1, and transfers the electric charges in the line L1 of the frame F4 to FD2. At the same time, the analog TDI circuit 220 transfers the electric charges in the line L4 of the frame F4 to FD3, and transfers the electric charges in the line L3 of the frame F4 to FD4. The electric charges in the line L1+L2 are held in FD1, and the voltage corresponding to the charge amount is converted into a digital signal. Further, the electric charges in the line L3+L4 are held in FD3, and the voltage corresponding to the charge amount is converted into a digital signal.

The arithmetic circuit 410 performs a CDS process on each of the digital signal output in the frame F2 and the digital signal output in the frame F4, and adds the CDS results. As a result, the line L1 of the frame F1, the line L2 of the frame F2, the line L3 of the frame F3, and the line L4 of the frame F4 are integrated. As described above, since the object moves line by line, the patterns of the respective lines to be integrated are the same. The arithmetic circuit 410 outputs the added lines as the last line of the TDI frame. The process of integrating exposure amounts with time shifted in this manner is called a TDI process.

Next, the analog TDI circuit 220 initializes FD3 and FD5, and transfers the electric charges in the line L2 of the frame F5 to FD2. At the same time, the analog TDI circuit 220 transfers the electric charges in the line L3 of the frame F5 to FD3, and transfers the electric charges in the line L4 of the frame F5 to FD4. At the same time, the analog TDI circuit 220 also transfers the electric charges in the line L5 of the frame F5 to FD5. The electric charges in the line L1+L2 are held in FD2, and the voltage corresponding to the charge amount is converted into a digital signal. Further, the electric charges in the line L3+L4 are held in FD4, and the voltage corresponding to the charge amount is converted into a digital signal.

The arithmetic circuit 410 performs a CDS process on each of the digital signal output in the frame F3, and the digital signal that corresponds to FD4 and is output in the frame F5, and adds the CDS results. As a result, the line L1 of the frame F2, the line L2 of the frame F3, the line L3 of the frame F4, and the line L4 of the frame F5 are integrated. The arithmetic circuit 410 outputs the added lines as the second line from the last of the TDI frame.

A process similar to the above is performed in the frame F6 and the frames that follow, and the rows of the TDI frame are sequentially output.

Note that the arithmetic circuit 410 performs the digital TDI process in addition to the CDS process, but can be designed to perform only the CDS process. Further, the solid-state imaging device 200 integrates four lines by analog and digital TDI processes, but can integrate a larger number of lines. Furthermore, the solid-state imaging device 200 integrates the first four lines from the first line for the first four frames, but is not limited to this configuration. For example, in a case where the moving direction of the object is reversed, the solid-state imaging device 200 is only required to integrate the four lines from the last for the first four frames.

Figure 24:
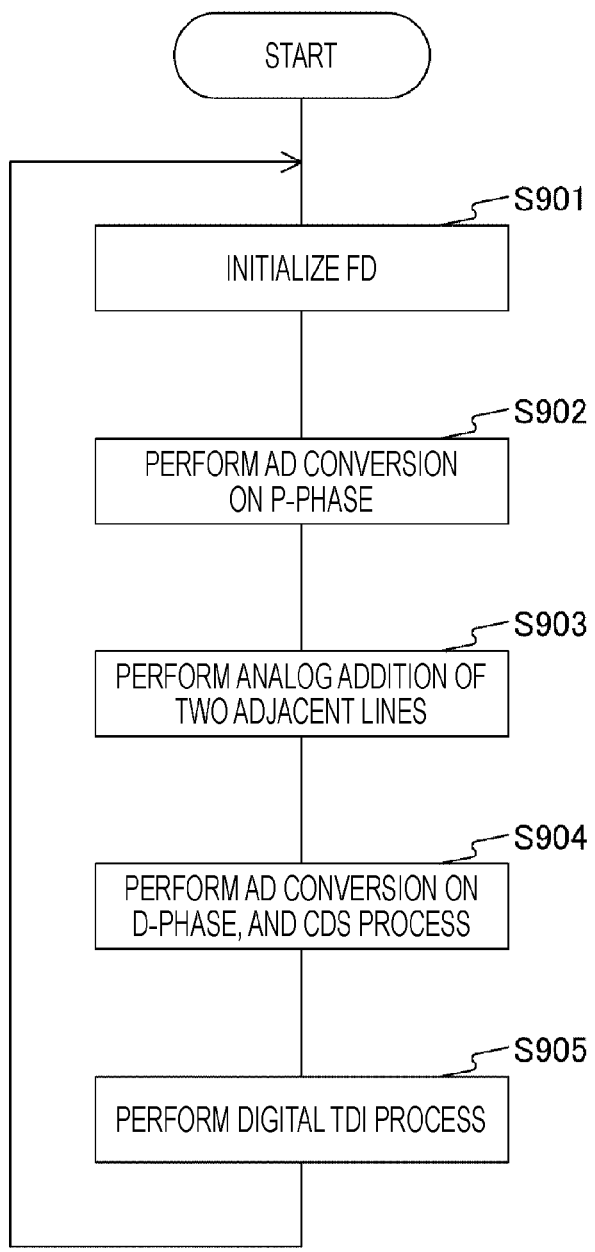
FIG. 24 is a flowchart showing an example operation of the solid-state imaging device according to the first embodiment of the present technology.

FIG. 24 is a flowchart showing an example operation of the solid-state imaging device 200 according to the first embodiment of the present technology. This operation is started when a predetermined application for imaging a frame is executed, for example.

The pixel drive circuit 252 in the solid-state imaging device 200 exposes all the pixels at the same time, and initializes the floating diffusion layers (FD1 and FD2) at the end of the exposure (step S901). The ADC 310 then performs AD conversion on P-phase levels of the initialized FDs (step S902).

Further, the analog TDI circuit 220 performs analog addition of the charge amounts in two adjacent lines through charge transfers (step S903). Further, the arithmetic circuit 410 converts the D-phase level of FDs holding the two lines, and performs the CDS process (step S904). Also, when the two lines are digitally output, the arithmetic circuit 410 performs the digital TDI process to add these lines (step S905). After step S905, the solid-state imaging device 200 repeatedly carries out step S901 and the steps that follow.

As described above, in the first embodiment of the present technology, the transfer unit 230 that switches the respective transfer destinations of PD1 and PD2 to either FD1 or FD2 is provided. Accordingly, it is possible to perform the charge transfer from PD1 to FD2 and the charge transfer from PD2 to FD1 at the same time. Thus, the scan rate can be increased, and the speed of AD conversion can be improved, as compared with those in a case where those charge transfers are sequentially performed.

Modification

In the first embodiment described above, the analog TDI circuits 220 generate pixel signals with a constant charge-voltage conversion efficiency. However, in order to reduce noise at a time of low illuminance, pixel signals are preferably generated with two charge-voltage conversion efficiencies that are different from each other. An analog TDI circuit 220 according to a modification of the first embodiment differs from that of the first embodiment in that pixel signals are generated with each of two charge-voltage conversion efficiencies that are different from each other.

Figure 25:
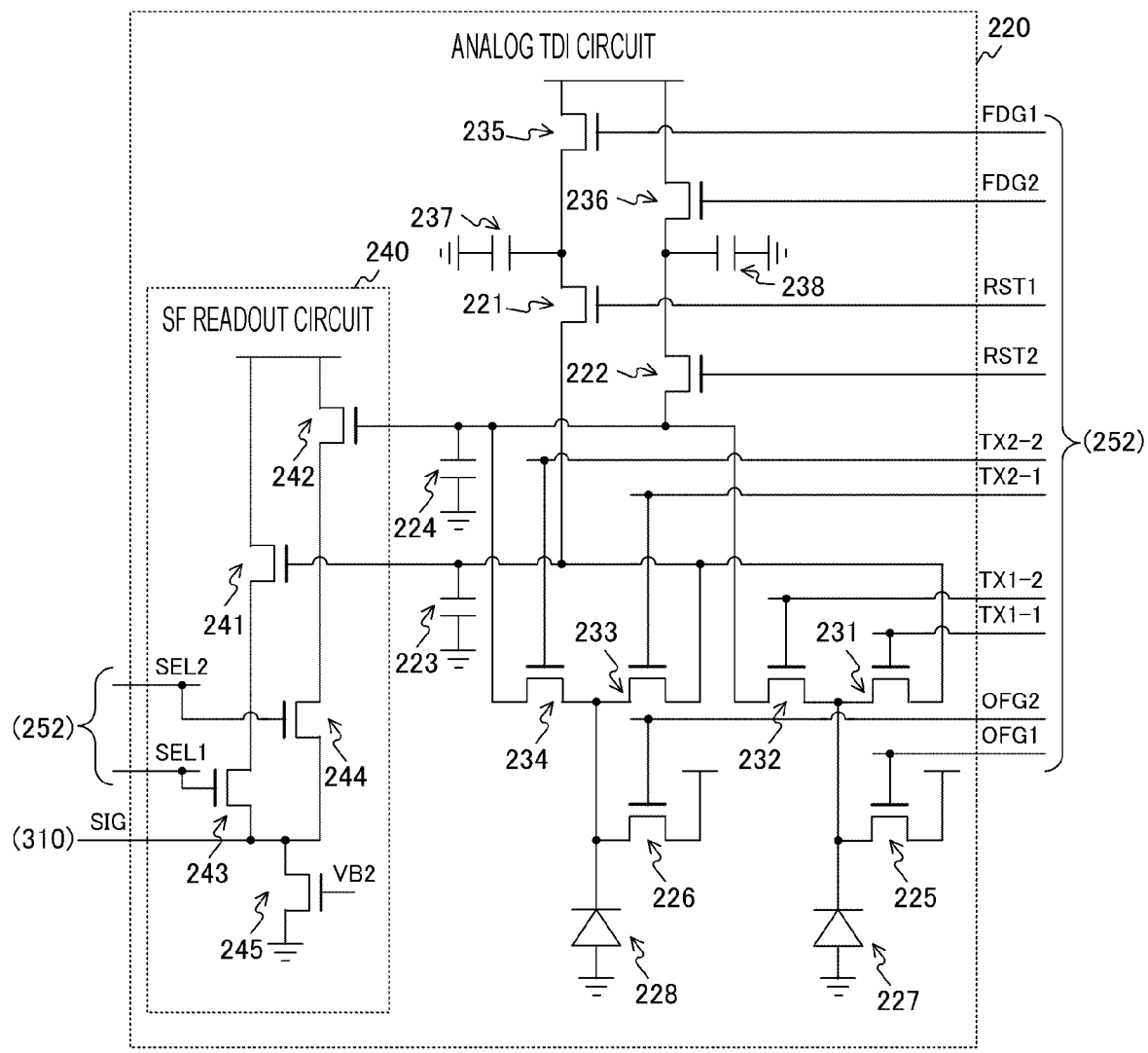
FIG. 25 is a circuit diagram showing an example configuration of an analog TDI circuit according to a modification of the first embodiment of the present technology.

FIG. 25 is a circuit diagram showing an example configuration of an analog TDI circuit 220 according to a modification of the first embodiment of the present technology. The analog TDI circuit 220 according to the modification of the first embodiment differs from that of the first embodiment in further including conversion efficiency control transistors 235 and 236, and capacitors 237 and 238. For example, nMOS transistors are used as the conversion efficiency control transistors 235 and 236.

The conversion efficiency control transistor 235 controls the charge-voltage conversion efficiency of the floating diffusion layer 223 (FD1) in accordance with a control signal FDG1. The conversion efficiency control transistor 236 controls the charge-voltage conversion efficiency of the floating diffusion layer 224 (FD2) in accordance with a control signal FDG2. The conversion efficiency control transistor 235 is connected in series to the reset transistor 221, and the capacitor 237 is inserted between the connecting point of these transistors and the ground terminal. The conversion efficiency control transistor 236 is connected in series to the reset transistor 222, and the capacitor 238 is inserted between the connecting point of these transistors and the ground terminal.

The pixel drive circuit 252 supplies a high-level control signal FDG1 over the pulse period immediately after the initialization of FD1, and thereafter, performs control at the low level, so that the analog TDI circuit 220 can have a charge-voltage conversion efficiency that is higher than a predetermined value. On the other hand, the pixel drive circuit 252 always supplies the high-level control signal FDG1, so that the analog TDI circuit 220 can have a charge-voltage conversion efficiency that is lower than the predetermined value. The same applies to FD2. Hereinafter, the higher charge-voltage conversion efficiency will be referred to simply as the "high conversion efficiency", and the lower charge-voltage conversion efficiency will be referred to simply as the "low conversion efficiency".

For example, the pixel drive circuit 252 generates pixel signals with both the high conversion efficiency and the low conversion efficiency, in accordance with control signals FDG. In a case where a digital signal generated with the high conversion efficiency is shorter than the full code, the arithmetic circuit 410 then outputs the digital signal generated with the high conversion efficiency as the signal of the pixel. On the other hand, in a case where the digital signal generated with the high conversion efficiency is a full-code signal, the arithmetic circuit 410 outputs the digital signal generated with the low conversion efficiency as the signal of the pixel. Thus, the dynamic range can be expanded, and noise in a low-illuminance signal can be reduced.

As described above, in the modification of the first embodiment of the present technology, an analog TDI circuit 220 generates pixel signals with both the high conversion efficiency and the low conversion efficiency, and selects one of the pixel signals, depending on whether or not the pixel signal is a full-code signal. Thus, noise at a time of low illuminance can be reduced.

2. Second Embodiment

In the first embodiment described above, a reset transistor is provided for each pixel. However, there is a possibility that the circuit size will increase with an increase in the number of pixels. An analog TDI circuit 220 of a second embodiment differs from that of the first embodiment in that the reset transistors are reduced, and the floating diffusion layers 223 and 224 are initialized through control on the charge emission transistors 225 and 226.

Figure 26:
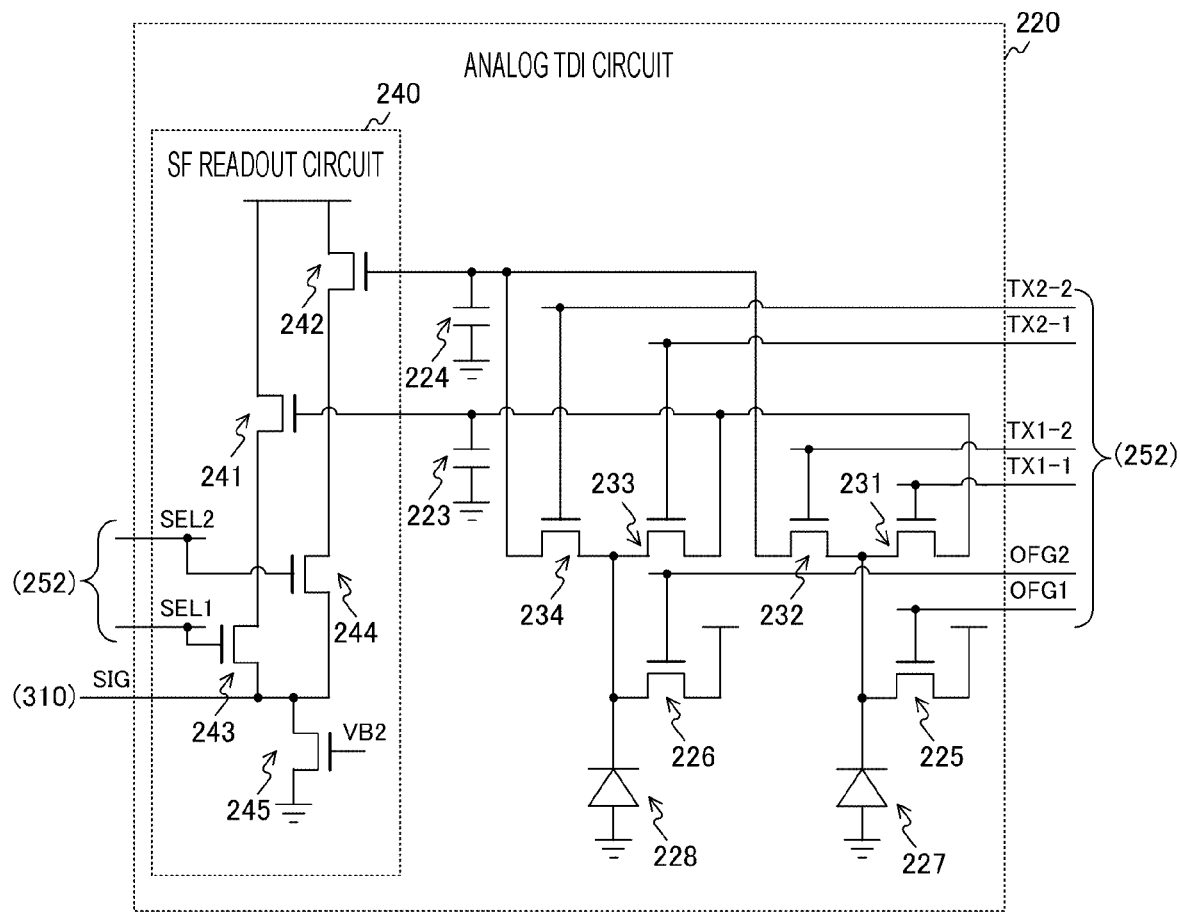
FIG. 26 is a circuit diagram showing an example configuration of an analog TDI circuit according to a second embodiment of the present technology.

FIG. 26 is a circuit diagram showing an example configuration of an analog TDI circuit 220 according to the second embodiment of the present technology. The analog TDI circuit 220 of the second embodiment differs from that of the first embodiment in not including the reset transistors 221 and 222.

Figure 27:
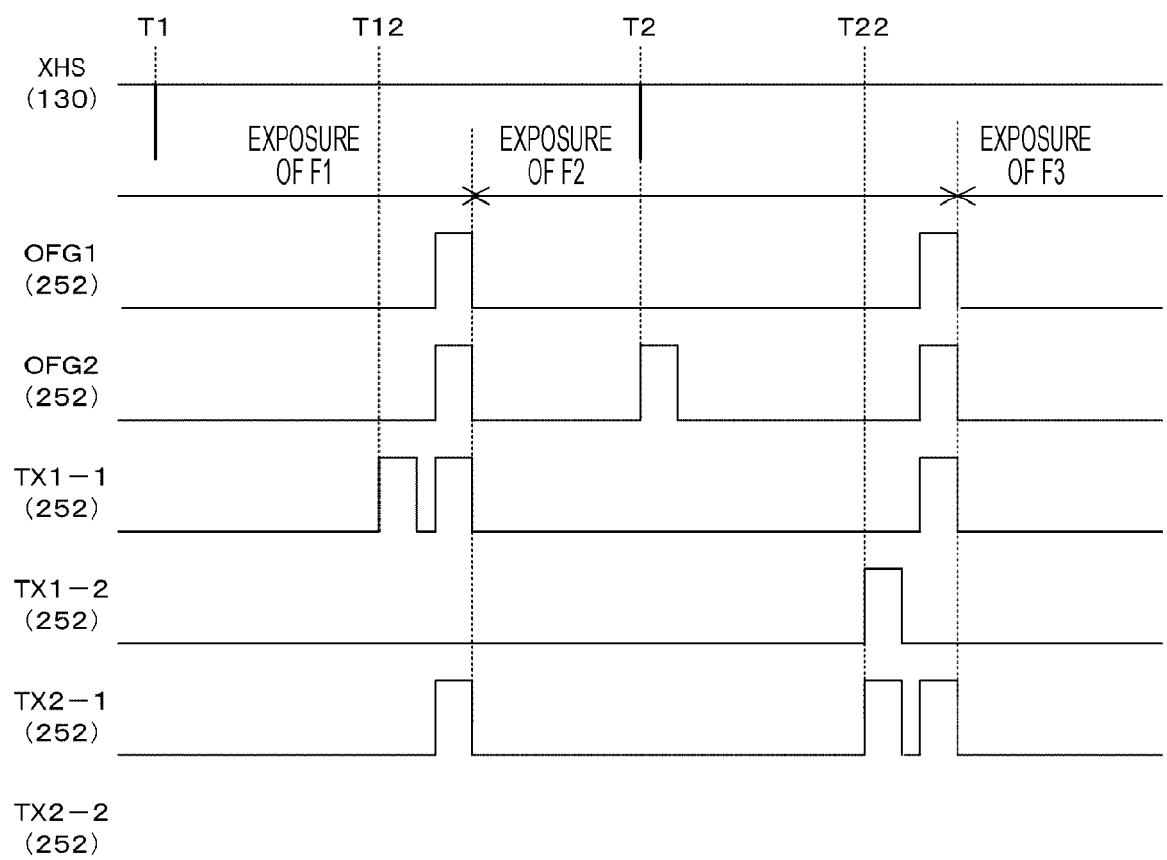
FIG. 27 is a timing chart showing an example of transistor control according to the second embodiment of the present technology.

FIG. 27 is a timing chart showing an example of transistor control according to the second embodiment of the present technology. At the timing of a start of exposure, the pixel drive circuit 252 transmits the transfer signals (TX1-1 and TX2-1) to all the pixels at the same time as the emission signals (OFG1 and OFG2). As a result, the floating diffusion layers 223 and 224 are initialized at the same time as the photoelectric conversion elements 227 and 228.

As described above, in the second embodiment of the present technology, the pixel drive circuit 252 initializes the floating diffusion layers 223 and 224 by controlling the charge emission transistors 225 and 226. This makes the reset transistors 221 and 222 unnecessary. Thus, the circuit size can be made smaller.

Modification

In the second embodiment described above, the analog TDI circuits 220 generate pixel signals with a constant charge-voltage conversion efficiency. However, in order to reduce noise at a time of low illuminance, pixel signals are preferably generated with two charge-voltage conversion efficiencies that are different from each other. An analog TDI circuit 220 according to a modification of the second embodiment differs from that of the second embodiment in that pixel signals are generated with each of two charge-voltage conversion efficiencies that are different from each other.

Figure 28:
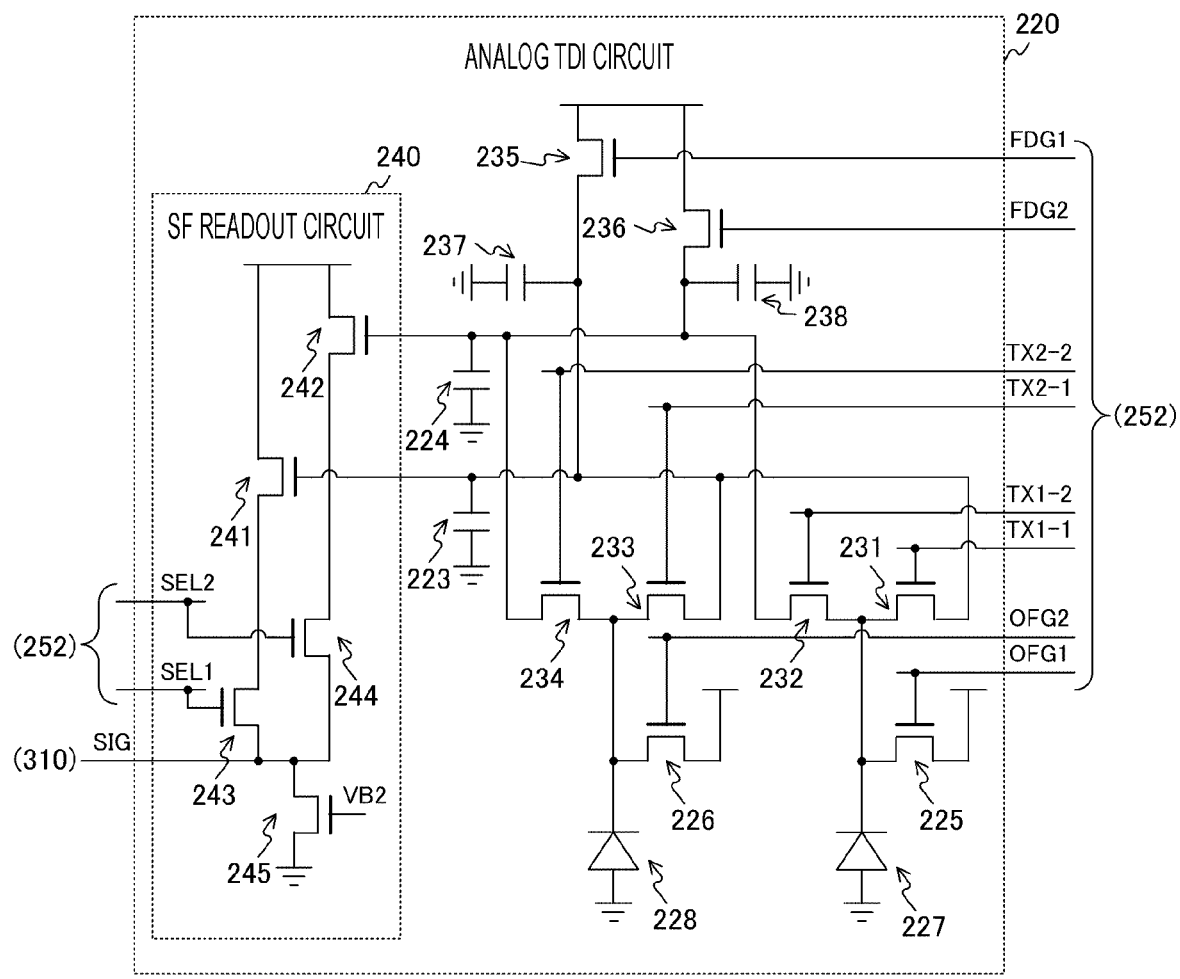
FIG. 28 is a circuit diagram showing an example configuration of an analog TDI circuit according to a modification of the second embodiment of the present technology.

FIG. 28 is a circuit diagram showing an example configuration of an analog TDI circuit 220 according to a modification of the second embodiment of the present technology. The analog TDI circuit 220 according to the modification of the second embodiment differs from that of the second embodiment in further including conversion efficiency control transistors 235 and 236, and capacitors 237 and 238.

The conversion efficiency control transistor 235 is inserted between the floating diffusion layer 223 and the power supply terminal, and the capacitor 237 is inserted between the ground terminal and the connecting point between the conversion efficiency control transistor 235 and the floating diffusion layer 223. The conversion efficiency control transistor 235 is inserted between the floating diffusion layer 223 and the power supply terminal, and the capacitor 237 is inserted between the ground terminal and the connecting point between the conversion efficiency control transistor 235 and the floating diffusion layer 223. The conversion efficiency control transistor 236 is inserted between the floating diffusion layer 224 and the power supply terminal, and the capacitor 238 is inserted between the ground terminal and the connecting point between the conversion efficiency control transistor 236 and the floating diffusion layer 224.

The transistor control method implemented by the pixel drive circuit 252 according to the modification of the second embodiment is similar to the control illustrated in FIG. 27.

As described above, in the modification of the second embodiment of the present technology, an analog TDI circuit 220 generates pixel signals with both the high conversion efficiency and the low conversion efficiency, and selects one of the pixel signals, depending on whether or not the pixel signal is a full-code signal. Thus, noise at a time of low illuminance can be reduced.

Note that the above described embodiments are examples for embodying the present technology, and the matter of the embodiments corresponds to the subject matter of the claims. Likewise, the subject matter of the claims corresponds to the matter under the same names as the subject matter of the claims in the embodiments of the present technology. However, the present technology is not limited to the embodiments, and various changes can be made to the embodiments without departing from the scope of the technology.

Note that the present technology can also be embodied in the configurations described below.

(1) A solid-state imaging device including:
  a pair of photoelectric conversion elements;
  a pair of floating diffusion layers; and
  a transfer unit that switches a transfer destination of each of the pair of photoelectric conversion elements to one of the pair of floating diffusion layers, and transfers electric charge to the transfer destination.

(2) The solid-state imaging device according to (1), in which the transfer unit simultaneously performs a process of transferring electric charge from one of the pair of photoelectric conversion elements to the other one of the pair of floating diffusion layers, and a process of transferring electric charge from the other one of the pair of photoelectric conversion elements to one of the pair of floating diffusion layers.

(3) The solid-state imaging device according to (2), in which
the transfer unit includes:
a first transfer transistor that transfers electric charge from one of the pair of photoelectric conversion elements to one of the pair of floating diffusion layers;
a second transfer transistor that transfers electric charge from the one of the pair of photoelectric conversion elements to the other one of the pair of floating diffusion layers;
a third transfer transistor that transfers electric charge from the other one of the pair of photoelectric conversion elements to the one of the pair of floating diffusion layers; and
a fourth transfer transistor that transfers electric charge from the other one of the pair of photoelectric conversion elements to the other one of the pair of floating diffusion layers.

(4) The solid-state imaging device according to any one of (1) to (3), further including
a pair of charge emission transistors that emit electric charge from each of the pair of photoelectric conversion elements.

(5) The solid-state imaging device according to any one of (1) to (4), further including
a pair of reset transistors that initialize each of the pair of floating diffusion layers.

(6) The solid-state imaging device according to any one of (1) to (5), further including
a pair of conversion efficiency control transistors that control charge-voltage conversion efficiency of the pair of floating diffusion layers.

(7) The solid-state imaging device according to any one of (1) to (6), further including:
a pair of amplification transistors that amplify voltage of each of the pair of floating diffusion layers, to generate a pair of pixel signals; and
a pair of select transistors that select one of the pair of pixel signals.

(8) The solid-state imaging device according to (7), further including an analog-to-digital converter that sequentially converts the respective pixel signals of the pair of pixel signals into digital signals.

(9) The solid-state imaging device according to (8), further including
an arithmetic circuit that integrates the digital signals.

(10) An imaging apparatus including:
a pair of photoelectric conversion elements;
a pair of floating diffusion layers;
a transfer unit that switch a transfer destination of each of the pair of photoelectric conversion elements to one of the pair of floating diffusion layers, and transfers electric charge to the transfer destination; and
a signal processing unit that converts a pixel signal corresponding to an amount of the electric charge into a digital signal, and processes the digital signal.

REFERENCE SIGNS LIST

100 Imaging apparatus
110 Optical unit
120 Storage unit
130 Control unit
140 Communication unit
200 Solid-state imaging device
201 Light receiving chip
202 Circuit chip
210 Pixel array unit
211 Pixel block
212 Peripheral circuits
220 Analog TDI circuit
221, 222 Reset transistor
223, 224 Floating diffusion layer
225, 226 Charge emission transistor
227, 228 Photoelectric conversion element
230 Transfer unit
231 to 234 Transfer transistor
235, 236 Conversion efficiency control transistor
237, 238, 329 Capacitor
240 SF readout circuit
241, 242 Amplification transistor
243, 244 Select transistor
245 Current source transistor
246, 247 Transistor placement unit
251 DAC
252 Pixel drive circuit
253 Time code generation unit
254 Pixel AD conversion unit
255 Vertical scanning circuit
256 Control circuit
257 Output circuit
260 Image processing circuit
300 Cluster
310 ADC
320 Differential input circuit
321, 324, 326, 331, 332, 334, 335 pMOS transistor
322, 323, 325, 327, 328, 333, 336, 337 nMOS transistor
330 Positive feedback circuit
340 Latch control circuit
350 Latch circuit
360 Repeater unit
400 Signal processing circuit
405 Selector
410 Arithmetic circuit
440 P-phase frame memory
450 Past frame memory

The invention claimed is:
1. A solid-state imaging device, comprising:
a pair of photoelectric conversion elements comprising a first photoelectric conversion element and a second photoelectric conversion element;
a pair of floating diffusion layers comprising a first floating diffusion layer and a second floating diffusion layer;
a pair of charge emission transistors configured to emit electric charge from each of the pair of photoelectric conversion elements; and
a transfer unit configured to:
switch a first transfer destination of the first photoelectric conversion element from the first floating diffusion layer to the second floating diffusion layer;
switch a second transfer destination of the second photoelectric conversion element from the second floating diffusion layer to the first floating diffusion layer; and
transfer the electric charge to the first transfer destination and the second transfer destination, wherein
the transfer unit includes:
a first transfer transistor configured to transfer the electric charge from the first photoelectric conversion element to the second floating diffusion layer;
a second transfer transistor configured to transfer the electric charge from the first photoelectric conversion element to the first floating diffusion layer;

a third transfer transistor configured to transfer the electric charge from the second photoelectric conversion element to the first floating diffusion layer; and a fourth transfer transistor configured to transfer the electric charge from the second photoelectric conversioni element to the second floating diffusion layer, and the pair of charge emission transistors is different from the transfer unit.

2. The solid-state imaging device according to claim 1, wherein the transfer unit is further configured to simultaneously transfer the electric charge from the first photoelectric conversion element to the second floating diffusion layer, and the electric charge from the second photoelectric conversion element to one of the first floating diffusion layer.

3. The solid-state imaging device according to claim 1, further comprising a pair of reset transistors configured to initialize each of the pair of floating diffusion layers.

4. The solid-state imaging device according to claim 1, further comprising a pair of conversion efficiency control transistors configured to control charge-voltage conversion efficiency of the pair of floating diffusion layers.

5. The solid-state imaging device according to claim 1, further comprising:

a pair of amplification transistors configured to amplify voltage of each of the pair of floating diffusion layers to generate a pair of pixel signals; and a pair of select transistors configured to select one of the pair of pixel signals.

6. The solid-state imaging device according to claim 5, further comprising an analog-to-digital converter configured to sequentially convert the respective pixel signals of the pair of pixel signals into digital signals.

7. The solid-state imaging device according to claim 6, further comprising an arithmetic circuit configured to integrate the digital signals.

8. An imaging apparatus, comprising:

a pair of photoelectric conversion elements comprising a first photoelectric conversion element and a second photoelectric conversion element;

a pair of floating diffusion layers comprising a first floating diffusion layer and a second floating diffusion layer;

a pair of charge emission transistors configured to emit electric charge from each of the pair of photoelectric conversion elements;

a transfer unit configured to:

switch a first transfer destination of the first photoelectric conversion element from the first floating diffusion layer to the second floating diffusion layer;

switch a second transfer destination of the second photoelectric conversion element from the second floating diffusion layer to the first floating diffusion layer; and transfer electric charge to the first transfer destination and the second transfer destination, wherein the transfer unit includes:

a first transfer transistor configured to transfer the electric charge from the first photoelectric conversion element to the second floating diffusion layer;

a second transfer transistor configured to transfer the electric charge from the first photoelectric conversion element to the first floating diffusion layer;

a third transfer transistor configured to transfer the electric charge from the second photoelectric conversion element to the first floating diffusion layer; and a fourth transfer transistor configured to transfer the eletric charge from the second photoelectric conversion element to the second floating diffusion layer, and the pair of charge emission transistors is different from the transfer unit; and a signal processing unit configured to:

convert a pixel signal corresponding to an amount of the electric charge into a digital signal; and process the digital signal.

\* \* \* \* \*